US008810443B2

(12) United States Patent
Steensgaard-Madsen

(10) Patent No.: US 8,810,443 B2
(45) Date of Patent: Aug. 19, 2014

(54) ANALOG-TO-DIGITAL CONVERTER SYSTEM AND METHOD

(75) Inventor: Jesper Steensgaard-Madsen, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 13/553,092

(22) Filed: Jul. 19, 2012

(65) Prior Publication Data
US 2013/0278453 A1    Oct. 24, 2013

Related U.S. Application Data

(60) Provisional application No. 61/636,372, filed on Apr. 20, 2012.

(51) Int. Cl.
*H03M 1/20*    (2006.01)
(52) U.S. Cl.
USPC ........... 341/131; 341/118; 341/120; 341/143; 341/155; 341/172
(58) Field of Classification Search
USPC .......... 341/118, 120, 143, 144, 155, 172, 131
See application file for complete search history.

(56) References Cited

U.S. PATENT DOCUMENTS

| 5,684,487 | A * | 11/1997 | Timko | 341/172 |
|---|---|---|---|---|
| 6,462,685 | B1 * | 10/2002 | Korkala | 341/131 |
| 7,286,075 | B2 * | 10/2007 | Hennessy et al. | 341/172 |
| 7,420,494 | B1 * | 9/2008 | Schreier | 341/143 |
| 7,920,082 | B2 * | 4/2011 | Kawai et al. | 341/131 |
| 8,232,905 | B2 * | 7/2012 | Steensgaard-Madsen | 341/155 |
| 8,466,304 | B2 * | 6/2013 | Baudot et al. | 554/169 |
| 2002/0041247 | A1 * | 4/2002 | Steensgaard-Madsen | 341/156 |
| 2003/0174080 | A1 * | 9/2003 | Brooks | 341/131 |
| 2004/0056788 | A1 * | 3/2004 | Yang et al. | 341/131 |
| 2005/0146453 | A1 * | 7/2005 | Jensen | 341/131 |
| 2011/0148676 | A1 * | 6/2011 | Waheed et al. | 341/131 |
| 2011/0210877 | A1 * | 9/2011 | Ali et al. | 341/120 |
| 2011/0285569 | A1 |  11/2011 | Steensgaard-Madsen |  |

OTHER PUBLICATIONS

"21.1 An 18b 12.5MHz ADC with 93dB SNR," ISSCC 2010 / Session 21 / Successive Approximation ADCs / 21.1.
LTC2208, 16-Bit, 130Msps ADC, Linear Technology 2005, 32 pages.
LTC2379-18, 18-Bit, 1.6Msps, Low Power SAR ADC with 101.2dB SNR, Linear Technology 2011, 26 pages.
R.J. Van De Plassche, "Dynamic Element Matching for High-Accuracy Monolithic D/A Converters," IEEE Journal of Solid-State Circuits, vol. SC-11, No. 6, Dec. 1976.
"FA 8.4: A 12b 128MSample/s ADC with 0.05LSB DNL," ISSCC97 / Session 8 / Data Converters / Paper FA 8.4, 1997.
L. Richard Carley, "A Noise-Shaping Coder Topology for 15+ Bit Converters," IEEE Journal of Solid-State Circuits, vol. 24, No. 2, 1989.
R.J. Van De Plassche et al., "A Monolithic 14-Bit A/D Converter," VUB ESSCIRC 1982.

* cited by examiner

*Primary Examiner* — Linh Nguyen
(74) *Attorney, Agent, or Firm* — McDermott Will Emery LLP

(57) ABSTRACT

An analog-to-digital converter (ADC) system and method. The ADC system in accord with one embodiment includes a sampling digital-to-analog converter configured to sample a combination of an analog signal value and an analog dither value, and a control circuit comprising a mismatch-shaping encoder. The control circuit is configured to sequentially apply a plurality of digital codes to the sampling digital-to-analog converter during an analog-to-digital conversion operation to derive a digital code representing the combination of the analog signal value and the analog dither value. Several embodiments are presented.

20 Claims, 11 Drawing Sheets

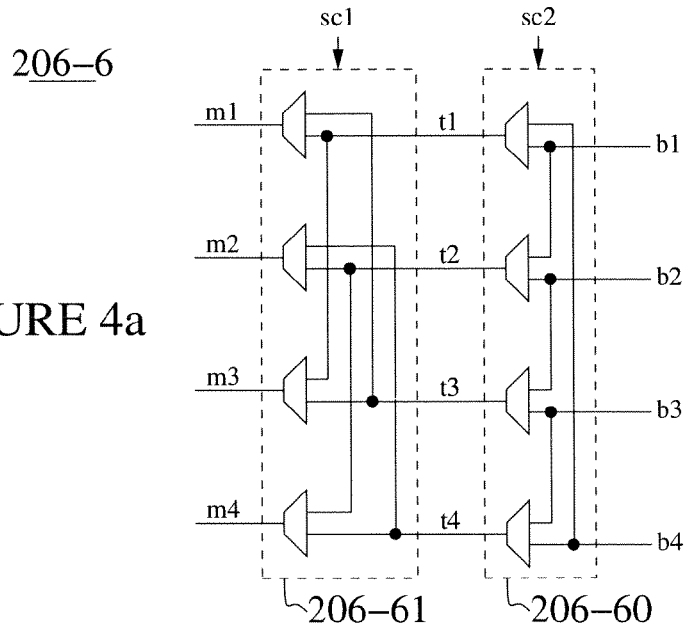
FIGURE 4a
| Rotary Scrambler | sc1=0 sc2=0 | sc1=0 sc2=1 | sc1=1 sc2=0 | sc1=1 sc2=1 |
|---|---|---|---|---|
| m1 | b1 | b4 | b3 | b2 |
| m2 | b2 | b1 | b4 | b3 |
| m3 | b3 | b2 | b1 | b4 |
| m4 | b4 | b3 | b2 | b1 |
| Sequence | S0 | S1 | S2 | S3 |
FIGURE 4b
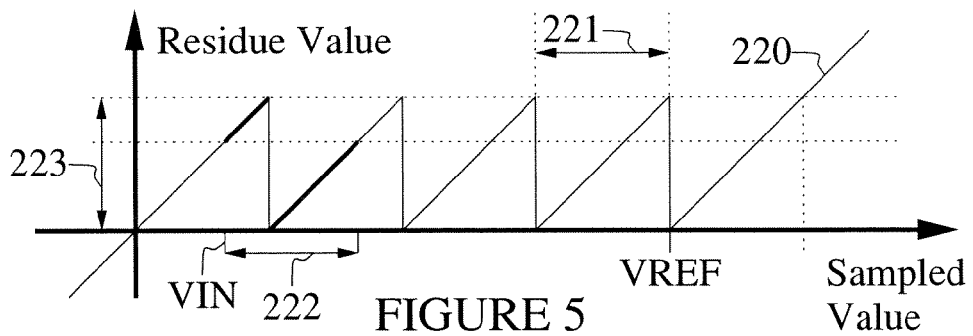
FIGURE 5

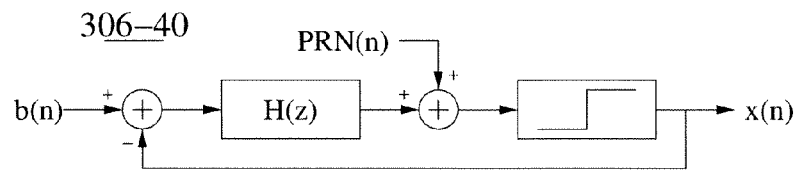
FIGURE 9
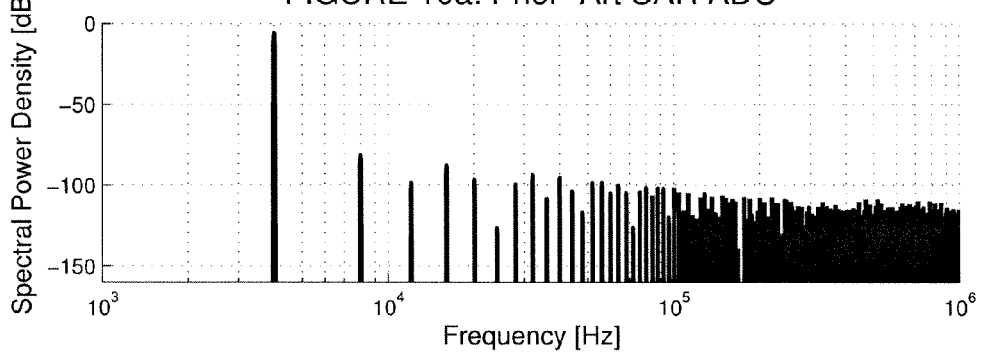
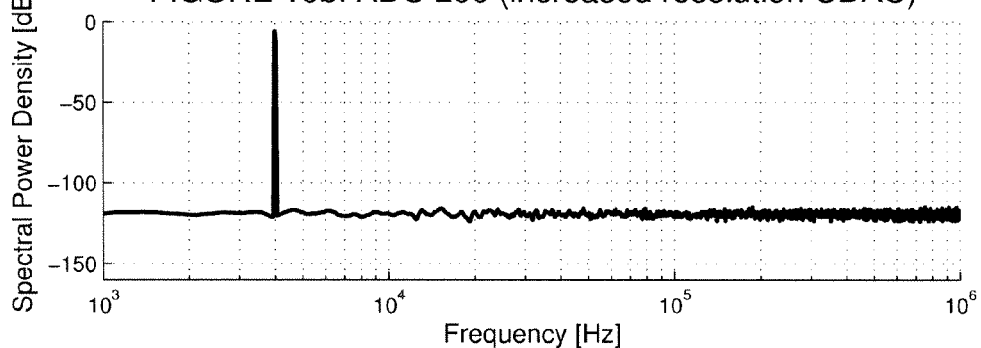
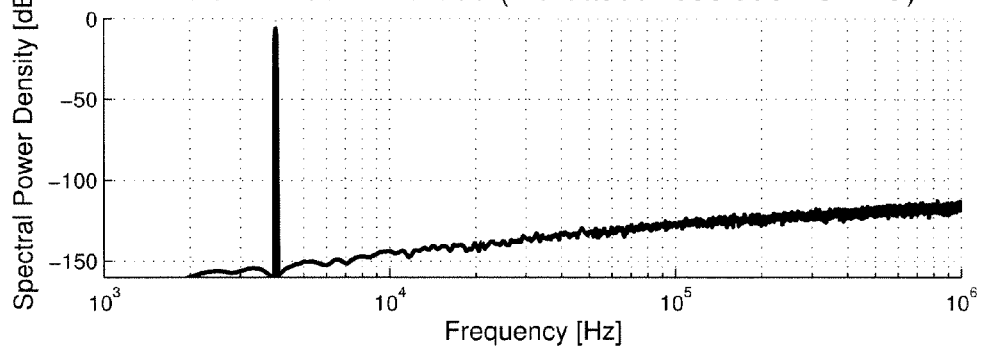

ANALOG-TO-DIGITAL CONVERTER SYSTEM AND METHOD

RELATED APPLICATION

This application claims priority to U.S. Provisional Application No. 61/636,372 filed on Apr. 20, 2012, the disclosure of which Application is incorporated by reference herein.

BACKGROUND

1. Technical Field

The present teaching relates to analog circuits and methods. Particularly, the present teaching relates to analog-to-digital converters (ADCs) and operating thereof

2. Discussion of Technical Background

Analog-to-digital converters (ADCs) are used for a wide range of applications, including, but not limited to, sensor interfaces, industrial applications, consumer applications, and communications. Various circuits and techniques have been developed for analog-to-digital (A/D) conversion targeting various applications and their varying requirements in terms of speed, resolution, noise, power consumption, and other performance related parameters.

FIG. 1 shows a prior-art successive-approximation-register (SAR) analog-to-digital converter (SAR ADC) 100. Successive approximation is a well-known sequential method used for A/D conversion, where an analog signal value VIN may be sampled on a capacitive digital-to-analog converter (CDAC) 101, and a sequential successive-approximation A/D conversion operation is used to generate an encoded numerical (digital) representation DOUT of the analog signal value VIN. A control circuit 102 may apply a sequence of digital codes to a plurality of input terminals 103 of CDAC 101 causing an output 104 of CDAC 101 to converge towards a predefined value (e.g., GND=0V). A comparator circuit 105 may provide an indication of a polarity of CDAC output 104. A digital control circuit 106 may use the indication of polarity to select a next digital code in the sequence of digital codes applied to CDAC input terminals 103. CDAC output 104 may represent a residue of analog signal value VIN with respect to a digital code applied to CDAC 101 incorporating a reference voltage VREF. The reference voltage may be embedded in a physical representation of a digital code. For example, a high state (logic "one") of a bit of a digital code may be represented physically by a first reference voltage potential VH=VREF applied to an input terminal 103; likewise, a low state (logic "zero") may be represented by applying a second reference voltage potential VL=GND=0V to the input terminal 103. Accordingly, a high/low logic value of a bit (a bit value) of a digital code may be applied to an input terminal of a CDAC by circuitry such as logic gates, switch drivers, and switches connecting the input terminal to a reference voltage circuit 107 providing a plurality of reference voltage potentials. When a residue is made to converge towards zero, a final digital code in a sequence of digital codes may be a digital representation of an analog signal value VIN. A digital circuit may combine bit values of the final digital code to provide an encoded numerical representation DOUT, which may be provided in a standardized format using standard logic levels (e.g., serial communication at 1.8V CMOS logic levels of a binary-weighted code).

A sampling node 104 of a CDAC (which is also an output 104 of CDAC 101 in FIG. 1, but a sampling node may be distinct from an output) may be coupled to a predefined potential (say ground, GND=0V) by a sampling switch 108 during an acquisition period. A charge portion may be substantially isolated on sampling node 104 at a sampling instance when sampling switch 108 is opened (i.e., when sampling switch 108 is controlled to be substantially non-conductive). By coupling an analog voltage signal VIN(t) to at least one CDAC input terminal 103 during an acquisition period, a value VIN of voltage signal VIN(t) at a sampling instance is effectively sampled on CDAC 101 (a substantially isolated charge portion is a sampled value representing VIN). Sampling switch 108 and one-or-more input switches 109 may be controlled by digital control circuit 106. An applied logic signal CNV may be used to control when to sample analog voltage signal VIN(t) and perform an A/D conversion of a sampled value VIN.

A selectable scaling of a sampled representation of an analog signal value VIN may be achieved by applying analog voltage signal VIN(t) to a selectable subset of CDAC input terminals 103 during an acquisition period. This aspect is described in U.S. Pat. No. 8,130,133, which is incorporated herein by reference for describing such scaling and the structure and operation of a prior-art successive-approximation ADC.

An input terminal of a CDAC may be assigned a weighting factor for characterizing how much a voltage variation at the input terminal affects a charge portion that may be isolated at a sampling node at a sampling instance. Weighting factors may alternately be viewed as (scaled) voltage gain factors from CDAC input terminals to a CDAC output when a sampling switch is open. For example, exemplary CDAC 101 of FIG. 1 may have four input terminals 103 with weighting factors (from left to right) w1=0.5, w2=0.25, w3=0.125, and w4=0.125. If an input voltage VIN=1.25V is applied to all four input terminals 103 at a sampling instance, a charge portion on sampling node 104 may be $(-Q_{samp})=C*VIN*(w1+w2+w3+w4)=C*VIN$. For a 5V reference voltage (first reference potential VREF=5V; second reference potential GND=0V) an identical value for Qsamp corresponds to a digital code '0100', which may alternately be described by 4 bit values b1=0, b2=1, b3=0, and b4=0. Accordingly, applying digital code '0100' to exemplary CDAC 101 may cause sampling node 104 to resume a predefined potential applied to it at a sampling instance when VIN=1.25V. This property reflects that $VIN/VREF=(b1*w1+b2*w2+b3*w3+b4*w4)/(w1+w2+w3+w4)=0.25$. A digital code may be said to correspond to an analog signal value VIN (for a given CDAC and reference voltage), or alternately that the digital code is a representation of analog signal value VIN (the digital representation based on a reference voltage and a plurality of weighting factors).

A quantization error may depend on a resolution of a CDAC. A digital code may be said to represent an analog signal value VIN when a residue on sampling node 104 is within a predefined range corresponding to a resolution. Accordingly, a digital code may correspond to (represent) any signal value in a range, not just a specific value for which a quantization error is exactly zero. A CDAC may have a relatively high resolution (say 20 bits), and a digital code may thus correspond to any signal value in a relatively narrow range.

A numerical value representing VIN/VREF may be calculated for a CDAC when it is operated in a manner similar to that described herein, when the CDAC is characterized by a set of weighting factors, and when a digital code corresponding to VIN is known. A plurality of digital codes may be equivalent, in a sense that they all substantially correspond to a single analog signal value VIN. For example, digital code '0011' is equivalent to digital code '0100' with respect to exemplary CDAC 101 of FIG. 1; both digital codes represent VIN/VREF=0.25. Nominally, it does not matter which of the two codes is provided by control circuit 102 for an A/D conversion operation of VIN=1.25V.

A CDAC for which several digital codes are equivalent may provide a measure of redundancy for an A/D conversion operation. Redundancy may facilitate a control circuit to recover from certain errors that may occur during a successive-approximation ADC operation, without having to go back to a step in the operation at which such errors may have occurred. For example, over-ranging techniques exemplify a use of redundancy to facilitate an ADC to recover from some errors. Over-ranging techniques are well known and may be used in pipeline ADCs, SAR ADCs, and many other types of ADCs. Several CDAC structures that facilitate over-ranging during an A/D conversion operation are described in US Patent Application Publication US2011/0115661 A1, which is incorporated herein by reference for describing over-ranging techniques, for describing several CDAC structures, and for describing ADC circuits that may be used in combination with the present teaching.

Persons skilled in the art can analyze a CDAC structure, identify its weighting factors, and devise a method to derive a suitable encoding of a numerical value represented by a digital code corresponding to an analog signal value with respect to the CDAC. A suitable encoding may use binary-weighted digital codes to represent numerical values. Many other suitable encoding techniques are known to persons skilled in the art. An encoding technique for reducing a latency parameter is described in US Patent Application Publication US 2011/0285567 A1, which is incorporated herein by reference for describing encoding techniques and for describing over-ranging techniques. Likewise, many structures for CDACs are known in the art, including CDACs utilizing capacitive voltage division to realize very small weighting factors, and also including CDACs wherein a resistive DAC circuit structure may be used to provide scaled voltages at nodes that are capacitively coupled to a sampling node. Accordingly, a capacitive digital-to-analog converter (CDAC) shall refer to any digital-to-analog converter structure (whether or not purely capacitive) having a sampling node at which a charge portion can be substantially isolated at a sampling instance, and having a plurality of input terminals that may be substantially characterized by weighting factors. Accordingly, an analog signal value can be sampled on a CDAC, and the CDAC may be substantially characterized by weighting factors assigned to each input terminal in a plurality of input terminals. These properties characterize a general class of circuits, sampling digital-to-analog converters, which include CDACs.

An accuracy of a numerical value representing VIN/VREF derived from a digital code applied to a CDAC characterized by a set of (assumed) weighting factors depends on how accurately the assumed weighting factors used for a calculation of the numerical value represent a set of actual weighting factors of the physical CDAC structure. A difference between the assumed weighting factors and the actual weighting factors may be referred to as "mismatch of weighting factors" or "weighting factor mismatch". Mismatch of weighting factors may (for example) be caused by mismatch of capacitor ratios in a CDAC. If assumed weighting factors are determined at design time, before a CDAC circuit is manufactured, weighting factor mismatch may be affected by manufacturing repeatability. Imperfect manufacturing repeatability of a CDAC may substantially degrade overall accuracy of an analog-to-digital converter system. A lower degree of weighting factor mismatch, and thus better overall accuracy, may be achieved by estimating (measuring) actual weighting factors of a CDAC after it has been manufactured. U.S. Pat. No. 7,705,765 describes how weighting factors of a CDAC may be measured, and how digital codes representing measured weighting factors may be stored and combined with a digital code from a A/D conversion operation to derive an encoded numerical value representing an analog signal value. U.S. Pat. No. 7,705,765 is incorporated herein by reference for describing how to measure, store, and apply codes representing weighting factors of a CDAC used in an analog-to-digital converter system, for describing over-ranging techniques, and for describing several CDAC structures and the implementation and operation of an ADC system based on successive approximation.

The circuits and methods described in U.S. Pat. No. 7,705,765 may facilitate very good estimation of CDAC weighting factors, and highly accurate ADC systems incorporating accurately estimated (assumed) weighting factors may be realized. However, a high degree of overall accuracy can be ensured only for as long as the actual weighting factors do not change substantially after the estimation process. Environmental changes (such as temperature variations) and other effects may cause some degree of weighting factor mismatch that may degrade an overall accuracy of an ADC for which weighting factors are not measured frequently. It may not be practical or desirable to interrupt an operation of an analog-to-digital converter system to measure weighting factors sufficiently frequently to ensure a long-term accurate operation.

What is needed is an analog-to-digital converter system that has a reduced sensitivity to weighting factor mismatch of a CDAC, such that highly accurate analog-to-digital converters can be implemented effectively and operated without interruption.

SUMMARY

In accord with one embodiment of the presented teachings, an analog-to-digital converter system comprises a sampling digital-to-analog converter configured to sample a combination of an analog signal value and an analog dither value, and a control circuit comprising a mismatch-shaping encoder. The control circuit is configured to sequentially apply a plurality of digital codes to the sampling digital-to-analog converter during an analog-to-digital conversion operation to derive a digital code.

In accord with another embodiment, an analog-to-digital converter system comprises a sampling digital-to-analog converter configured to sample a first analog value comprising a portion of an analog signal value and a portion of an analog dither value; a dither generator circuit configured to apply a digital dither code to the sampling digital-to-analog converter at a sampling instance, and a control circuit configured to derive a first digital code to represent the first analog value, the control circuit is further configured to combine the first digital code and the digital dither code to derive an encoded numerical representation of the analog signal value. The dither generator circuit is configured to be responsive to a preceding digital code derived during a preceding analog-to-digital conversion operation to represent an analog value.

In accord with a further embodiment of an analog-to-digital converter (ADC), the ADC comprises a capacitive digital-to-analog converter configured to sample a combination of an analog signal value and an analog dither value, and a control circuit which comprises a scrambler circuit for scrambling bit values. The control circuit sequentially applies a plurality of digital codes to the capacitive digital-to-analog converter during a conversion operation to derive an encoded numerical representation of the analog signal value.

In accord with yet a further embodiment, an analog-to-digital converter system comprises a sampling digital-to-analog converter configured to sample an analog value and to provide a representation of a residue of the sampled analog value with respect to a digital code, a plurality of registers configured to store codes representing weighting factors of the sampling digital-to-analog converter measured to account for variations in a manufacturing process, and a control circuit comprising a mismatch-shaping encoder. The control circuit is configured to derive and apply a first digital code to the sampling digital-to-analog converter during an analog-to-digital conversion operation. Further included is a digital circuit configured to combine bit values of the first digital code with codes stored in the plurality of registers to derive a digital output code.

In accord with another embodiment, an analog-to-digital converter operating in a sampling phase and a conversion phase comprises a sampling digital-to-analog converter having a first plurality of input terminals and a second plurality of input terminals; and a control circuit comprising a mismatch-shaping encoder. In the sampling phase, the control circuit is configured to couple an analog input signal to at least one terminal in the first plurality of input terminals and to apply a digital dither code to the second plurality of input terminals. In the conversion phase, the control circuit is configured to sequentially apply a plurality of digital codes to the sampling digital-to-analog converter to derive an encoded numerical representation of a value of the analog input signal at a sampling instance.

In accord with another embodiment, a capacitive digital-to-analog converter is configured to sample a first analog value comprising a portion of an analog signal value and a portion of an analog dither value. A dither generator circuit applies a digital dither code to the capacitive digital-to-analog converter during an acquisition period. A control circuit is configured to derive a first digital code to represent the first analog value. The control circuit combines the first digital code and the digital dither code to derive an encoded numerical representation of the analog signal value. The dither generator circuit is responsive to a preceding digital code derived during a preceding analog-to-digital conversion operation to represent an analog value.

A method for deriving an encoded numerical representation of an analog signal value using a sampling digital-to-analog converter having a plurality of input terminals, in accord with an embodiment of this disclosure, comprises isolating a first charge portion on a sampling node of the sampling digital-to-analog converter while applying a first digital dither code to at least one input terminal in the plurality of input terminals; applying a first digital code to the sampling digital-to-analog converter for which a potential of the sampling node is within a predefined range; generating a second digital dither code responsive to the first digital code; and combining the first digital dither code and the first digital code to derive the encoded numerical representation of the analog signal value.

BRIEF DESCRIPTION OF THE DRAWINGS

The present teachings claimed and/or described herein are further described in terms of exemplary embodiments. These exemplary embodiments are described in detail with reference to drawings. These embodiments are non-limiting exemplary embodiments, in which like reference numerals represent similar structures throughout the several views of the drawings, and wherein:

FIG. 4a illustrates a scrambler circuit 206-6 incorporated in digital control circuit 206 (FIG. 3);

FIG. 4b illustrates a truth table for permutations (which may be described as sequences) provided by scrambler circuit 206-6 (FIG. 4a) versus scrambler codes;

FIG. 5 illustrates a nominal saw-tooth relationship between a sampled value and a residue after bit values b1, b2, b3, b4 are determined in ADC 200 (FIG. 2);

FIG. 9 illustrates a block diagram of a mismatch-shaping dither generator 306-40 that may be incorporated in a mismatch-shaping dither generator 306-4 (FIG. 8a);

FIG. 10a illustrates a performance of a prior-art successive-approximation SAR ADC;

FIG. 10b illustrates a performance of an embodiment of the present teachings, ADC 200 with an increased resolution CDAC;

FIG. 10c illustrates a performance of an embodiment of the present teachings, ADC 300 with an increased resolution CDAC;

DETAILED DESCRIPTION

Figure 1:
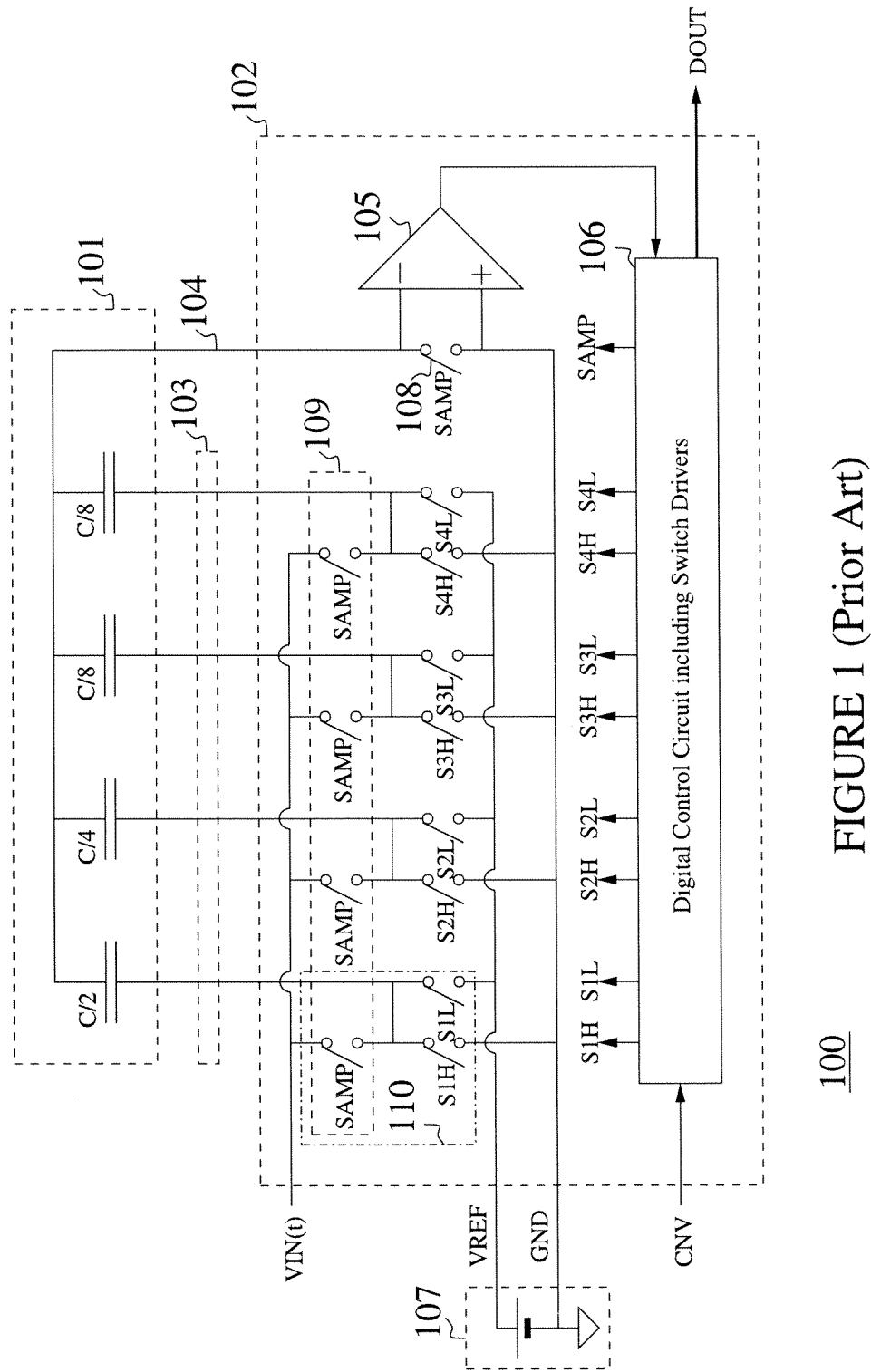
FIG. 1 (Prior Art) illustrates a successive-approximation analog-to-digital converter (ADC) 100.
Figure 2:
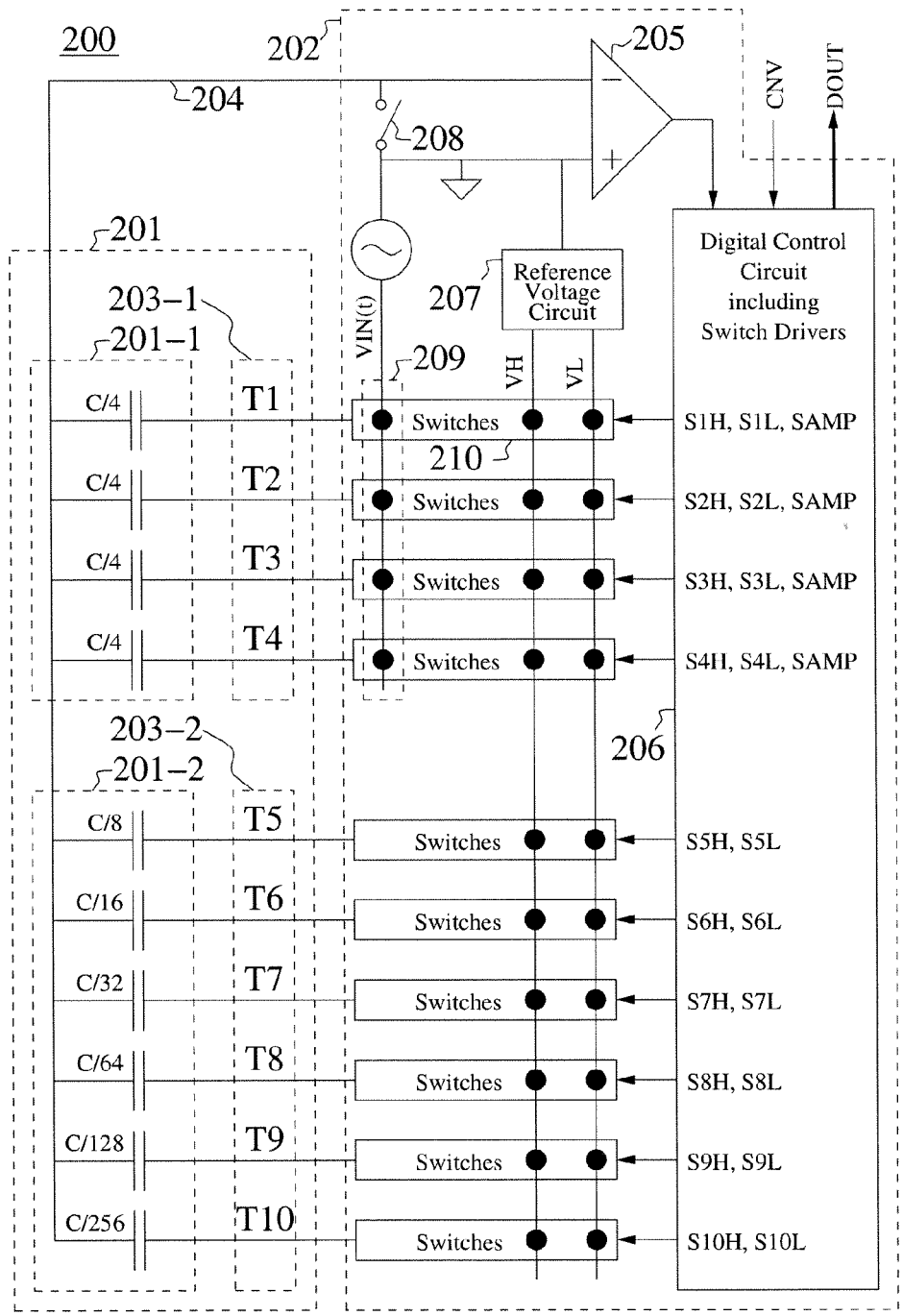
FIG. 2 illustrates a first preferred embodiment of the present teaching ADC 200.

FIG. 2 shows a first preferred embodiment of an analog-to-digital converter (ADC) 200 according to the present teachings. A structure of ADC 200 has several similarities to prior-art ADC 100 of FIG. 1. The structure of ADC 200 will be described first with reference to ADC 100. Several important differences between ADCs 100 and 200 will be described subsequently.

ADC 200 comprises a CDAC 201 and a control circuit 202 (compare to CDAC 101 and control circuit 102 of ADC 100). CDAC 201 comprises a first plurality of capacitors 201-1 and a second plurality of capacitors 201-2, which are connected by a sampling node 204 on which a charge portion may be substantially isolated when a sampling switch 208 is opened at a sampling instance (compare to sampling node 104 and sampling switch 108 of ADC 100). First plurality of capacitors 201-1 is coupled to control circuit 202 via a first plurality of input terminals 203-1. Second plurality of capacitors 201-2 is coupled to control circuit 202 via a second plurality of input terminals 203-2 (compare to input terminals 103 and control circuit 102 of ADC 100). A comparator circuit 205 is configured to indicate a polarity of a potential of sampling node 204. A digital control circuit 206 is configured to receive the indication of polarity and to provide a sequence of digital codes applied to CDAC 201 via CDAC input terminals 203-1, 203-2 (compare to comparator circuit 105, digital control circuit 106, and input terminals 103 of ADC 100). Digital codes applied to CDAC 201 are represented physically by well-controlled reference voltage potentials (VH=VREF represents logic "one", VL=GND=0V represents logic "zero") provided by a reference voltage circuit 207 (compare to CDAC 101 and reference voltage circuit 107 of ADC 100). Digital control circuit 206 is configured to drive switches to couple input terminals 203-1, 203-2 to either an input voltage signal VIN(t) or a reference voltage potential provided by reference voltage circuit 207. A group of switches 210 in ADC 200 is equivalent to a group of switches 110 in ADC 100. Switches 210 in FIG. 2 are represented by a graphical representation that is more compact than a graphical representation of switches 110 in FIG. 1. A more compact representation of switches 210 is used in FIG. 2 to better illustrate important aspects (details) of the present teaching. It will be understood by persons skilled in the art that a group of selectable connections 209 in FIG. 2 illustrate a structure and a function equivalent to that of input switches 109 in FIG. 1.

A change in an applied logic signal CNV initiates an A/D conversion operation, starting with sampling a combination of an analog signal value VIN and an analog dither value on CDAC 201. Digital control circuit 206 is configured to be responsive to CNV and is configured to open sampling switch 208 at a sampling instance to substantially isolate a charge portion on sampling node 204. A substantially isolated charge portion on node 204 is a sampled value representing a combination of a plurality of voltage potentials applied to input terminals 203-1, 203-2 at the sampling instance. Digital control circuit 206 is configured to control switches to couple input voltage signal VIN(t) to input terminals T1,T2,T3, and T4 in the first plurality of input terminals 203-1 during an acquisition period preceding the sampling instance. Digital control circuit 206 is further configured to control switches to apply a substantially random digital code to input terminals T5, T6, T7, T8, T9, and T10 in the second plurality of input terminals 203-2 during the acquisition period.

A pseudo-random-number (PRN) generator is included in digital control circuit 206 and configured to produce a plurality of substantially random coin-toss bit value sequences. A conventional linear-feedback-shift-register (LFSR) and/or a cellular-automata-shift-register (CASR) circuit may be used to produce a sequence of sufficiently random bit values (a long periodic LFSR/CASR sequence may be characterized as "substantially random" or "sufficiently random"). Digital control circuit 206 is configured to apply a substantially random 6-bit code DX to CDAC input terminals 203-2 via switch control signals (S5H, S5L, S6H, S6L, S7H, S7L, S8H, S8L, S9H, S9L, S10H, S10L) during an acquisition period. DX may be described by 6 bit values $x5, x6, x7, x8, x9, x10$, each having an index referring to an index of a corresponding CDAC input terminal. For example, if DX='001011' ($x5=0$, $x6=0$, $x7=1$, $x8=0$, $x9=1$, $x10=1$) switches are configured to couple reference voltage potential VH to input terminals T7, T9, and T10 and reference voltage potential VL to input terminals T5, T6, T8. CDAC 201 may be characterized by a plurality of weighting factors characterizing how substantially random code DX corresponds to a substantially random analog "dither" value Vdither(DX) sampled on CDAC 201 at a sampling instance.

A charge portion that is sampled on CDAC 201 (substantially isolated on sampling node 204 at a sampling instance) is a sampled value representing a combination of an analog signal value VIN applied to CDAC 201 via terminals 203-1 and a substantially random analog dither value Vdither(DX) applied to CDAC 201 via terminals 203-2. Accordingly, CDAC 201 is configured to sample a combination of an analog signal value and an analog dither value.

CDAC 201 may be characterized by a plurality of nominal weighting factors $w(T1)=\frac{1}{4}$, $w(T2)=\frac{1}{4}$, $w(T3)=\frac{1}{4}$, $w(T4)=\frac{1}{4}$, $w(T5)=\frac{1}{8}$, $w(T6)=\frac{1}{16}$, $w(T7)=\frac{1}{32}$, $w(T8)=\frac{1}{64}$, $w(T9)=\frac{1}{128}$, $w(T10)=\frac{1}{256}$. Weighting factors may be scaled by any factor for convenience (without changing a physical structure CDAC 201). It may be convenient to scale weighting factors such that a sum of a selected group of weighting factors is unity. A scaling is selected such that $w(T1)+w(T2)+w(T3)+w(T4)=1$.

Control circuit 202 is configured to apply a sequence of digital codes to CDAC 201 to derive a 10-bit digital code DY corresponding to a combined signal and dither value sampled on CDAC 201 at a sampling instance. Digital code DY may be characterized by 10 bit values $y1, y2, y3, \ldots, y10$ each having an index referring to an index of a corresponding CDAC input terminal. Control circuit 202 is configured to calculate DOUT as a weighted sum of bit values and bit-value-differences $DOUT=y1*w(T1)+y2*w(T2)+y3*w(T3)+y4*w(T4)+(y5-x5)*w(T5)+(y6-x6)*w(T6)+(y7-x7)*w(T7)+(y8-x8)*w(T8)+(y9-x9)*w(T9)+(y10-x10)*w(T10)$. For example, for DX='100011' and DY='1011_011010', control circuit 202 is configured to calculate $DOUT=(1+0+1+1)/4+(0-1)/8+(1-0)/16+(1-0)/32+(0-0)/64+(1-1)/128+(0-1)/256=183/256$.

CDAC 201 is redundant and weighting factors $w(T1)$, $w(T2)$, $w(T3)$, $w(T4)$ are nominally identical. A permutation of bit values y1, y2, y3, y4 for any code DY does not change a nominal value of DOUT. Accordingly, an ordering of bit values y1, y2, y3, y4 does not affect DOUT or a nominal operation of ADC 200. For example, DY codes '1100_000000', '0110_000000' '0011_000000', '1010_000000' are nominally equivalent and represent DOUT=0.5 for DX='000000'.

Digital control circuit 206 is configured to use a successive-approximation search algorithm to derive a code DY representing a value sampled on CDAC 201. Bit values y1, y2, y3, y4, are determined in one of several distinct sequences to derive one of several nominally equivalent codes. A first sequence S0=[y1,y2,y3,y4] will be used to describe an operation. In a first step (sequence S0), a first digital code '1000_000000' is applied to CDAC 201 and bit value y1 is set according to a polarity indicated by comparator circuit 205. For example, if a negative polarity of sampling node 204 is indicated, then y1 is set to 1; otherwise y1 is set to 0. In a second step, a second digital code 'y1_100_000000' is applied and bit value y2 is set according to a polarity indicated by comparator circuit 205. In a third step, a third digital code 'y1_y2_10_000000' is applied and bit value y3 is set according to a polarity indicated by comparator circuit 205. The successive-approximation A/D conversion process continues in this manner for 10 steps to determine 10 bits values, resulting in a code DY='y1_y2_y3_y4_y5_y6_y7_y8_y9_y10' representing an analog value sampled on CDAC 201.

A sequence for bit values y1, y2, y3, y4 is selected on a substantially random basis by bit values provided by a PRN generator. A plurality of predefined sequences is supported by a hardware implementation of digital control circuit 206. N items can be ordered in N-factorial distinct sequences, and hence up to 4!=24 distinct sequences may be considered for identifying y1, y2, y3, y4 using a successive approximation algorithm. It may be advantageous to select a lower number of sequences to be supported by a digital control circuit. Digital control circuit 206 supports 4 distinct sequences: S0=[y1, y2, y3, y4]; S1=[y2, y3, y4, y1]; S2=[y3, y4, y1, y2]; S3=[y4, y1, y2, y3]. For each new A/D conversion operation, one of the 4 distinct sequences is selected on a substantially random basis to be used for the A/D conversion operation. For example, assume sequence S2 is selected by a state of a PRN generator. In a first step of a conversion operation for sequence S2, digital control circuit 206 is configured to apply a first digital code '0010__000000' to CDAC 201 and set bit value y3 according to a polarity indicated by comparator circuit 205. In a second step of a conversion operation for sequence S2, digital control circuit 206 is configured to apply a second digital code '00_y3__1__000000' to CDAC 201 and set bit value y4 according to a polarity indicated by comparator circuit 205. In a third step of a conversion operation for sequence S2, digital control circuit 206 is configured to apply a third digital code '10_y3_y4__000000' to CDAC 201 and set bit value y1 according to a polarity indicated by comparator circuit 205. In a fourth step of a conversion operation for sequence S2, digital control circuit 206 is configured to apply a fourth digital code 'y1_1_y3_y4__000000' to CDAC 201 and set bit value y2 according to a polarity indicated by comparator circuit 205. The successive-approximation A/D conversion operation continues with six additional steps, to determine bit values y5, y6, y7, y8, y9, y10 in sequence.

Figure 3:
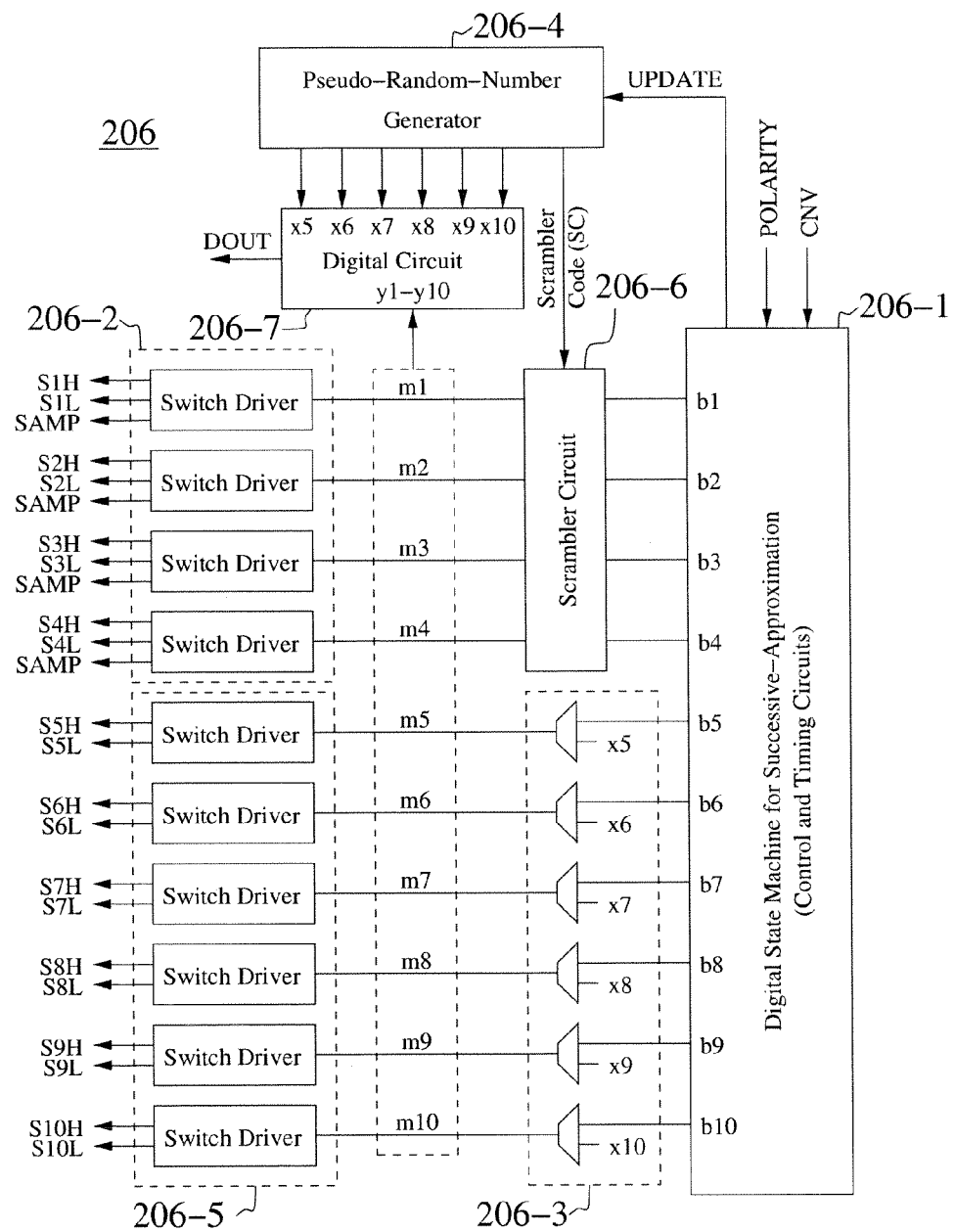
FIG. 3 illustrates a digital control circuit 206 incorporated in ADC 200 (FIG. 2)

FIG. 3 shows a structure of digital control circuit 206. During an acquisition period, a digital state machine for successive approximation 206-1 is configured to control a first plurality of switch drivers 206-2 (a control signal is not shown explicitly) to provide switch control signals SAMP, S1H, S1L, S2H, S2L, S3H, S3L, S4H, S4L controlling switches, including sampling switch 208 and input switches 209, to apply analog voltage signal VIN(t) across first plurality of capacitors 201-1 (see FIG. 2). Digital state machine 206-1 is further configured to control a plurality of digital multiplexer circuits 206-3 (a control signal is not shown explicitly), such that a plurality of substantially random bit values x5, x6, x7, x8, x9, x10 provided by a PRN generator 206-4 is coupled to a second plurality of switch drivers 206-5 providing switch control signals S5H, S5L, S6H, S6L, S7H, S7L, S8H, S8L, S9H, S9L, S10H, S10L controlling switches coupled to the second plurality to input terminals 203-2 of CDAC 201 (see FIG. 2). Digital state machine 206-1 is configured to be responsive to an applied logic signal CNV, which may transition to mark a sampling instance and initiate an A/D conversion operation. In response to a change in CNV, digital state machine 206-1 controls switch drivers 206-2 to open sampling switch 208 and input switches 209 to isolate a charge portion on sampling node 204 (see FIG. 2). Switch drivers 206-2, 206-5 are then controlled to provide switch control signals to apply a digital code M composed of a plurality of bit values m1, m2, m3, m4, m5, m6, m7, m8, m9, m10 to CDAC 201. Digital multiplexer circuit 206-3 is configured to set bit values m5, m6, m7, m8, m9, m10 equal to a plurality of bit values b5, b6, b7, b8, b9, b10 provided by digital state machine 206-1. A scrambler circuit 206-6 is configured to receive a scrambler code SC from PRN generator 206-4, and to provide bit values m1, m2, m3, m4 as a permutation of a plurality of bit values b1, b2, b3, b4 provided by digital state machine 206-1. Scrambler code SC selects m1, m2, m3, m4 as a predefined permutation of b1, b2, b3, b4 corresponding to a predefined sequence for y1, y2, y3, y4. For example, sequence S2=[y3, y4, y1, y2] may be selected by configuring scrambler circuit 206-6 such that m3=b1; m4=b2; m1=b3; m2=b4. Digital state machine 206-1 is configured to implement a successive-approximation-register search algorithm (testing b1=1 in a first step; testing b2=1 in a second step; and so on) after sampling a value in response to a change in CNV.

Consider a conversion operation for which scrambler code SC is set to select sequence S2. In a first step, m3=b1=1 and a first code M='0010__000000' is applied to CDAC 201. The first step is complete when y3=m3=b1 is set according to a polarity indicated by comparator circuit 205. In a second step, m4=b2=1 and a second code M='00_y3_1__000000' is applied to CDAC 201. The second step is complete when y4=m4=b2 is set according to a polarity indicated by comparator circuit 205. Digital state machine 206-1 continues the successive-approximation algorithm for each remaining bit in sequence b3, b4, b5, b6, b7, b8, b9, b10. When each bit value b1-b10 has been determined, bit values y1=m1, y2=m2, y3=m3, . . . , y10=m10 (collectively DY=M) are combined with bit values x5, x6, x7, x8, x9, x10 (collectively DX) as described earlier. A digital circuit 206-7 comprises latches to capture bit values of digital codes DX and DY at an end of a conversion. Digital circuit 206-7 further comprises a combinatorial circuit for calculating DOUT=y1*w(T1)+y2*w(T2)+y3*w(T3)+y4*w(T4)+(y5−x5)*w(T5)+(y6−x6)*w(T6)+(y7−x7)*w(T7)+(y8−x8)*w(T8)+(y9−x9)*w(T9)+(y10−x10)*w(T10). Digital circuit 206-7 may be configured with memory circuits (e.g., registers) to store digital codes for weighting factors of CDAC 201, which may be estimated after ADC 200 is manufactured to account for variations in a manufacturing process. Digital state machine 206-1 then controls PRN generator 206-4 to update/renew scrambler code SC and bit values of DX for a next acquisition period and A/D conversion operation.

FIG. 4a shows scrambler circuit 206-6 in more detail. Scrambler code SC comprises a first bit value sc1 and a second bit value sc2. A plurality of bit values t1, t2, t3, t4 are a first permutation (controlled by sc2) of bit values b1, b2, b3, b4. A first digital multiplexer circuit 206-60 is configured to provide t1=b1, t2=b2, t3=b3, t4=b4 for sc2=0 and t2=b1, t3=b2, t4=b3, t1=b4 for sc2=1. A second digital multiplexer circuit 206-61 is configured to provide bit values m1, m2, m3, m4 as a permutation of bit values t1, t2, t3, t4 according to sc1. Specifically, digital multiplexer circuit 206-61 is configured such that m1=t1, m2=t2, m3=t3, m4=t4 for sc1=0 and m3=t1, m4=t2, m1=t3, m2=t4 for sc1=1. FIG. 4b shows a mapping of bit values b1, b2, b3, b4 to bit values m1, m2, m3, m4 for all scrambler codes. It may be recognized that sc2 controls a 1-position-rotation of a code 'b1_b2_b3_b4' and that sc1 controls a 2-position-rotation of a code 't1_t2_t3_t4'. Accordingly, it may be recognized that a numerical value N of SC='sc1_sc2' controls a N-position-rotation of code 'b1_b2_b3_b4'. A scrambler circuit that substantially rotates an input code to derive a permutation output code may be referred to as a "rotary scrambler".

Scrambler circuit 206-6 implements a function known in the art as "dynamic element matching", which was described by L. Richard Carley in IEEE Journal of Solid-State Circuits, Volume 24, April 1989. An aspect of dynamic element matching is that errors caused by mismatch of weighting factors w(T1), w(T2), w(T3), w(T4) (which may be referred to as mismatch-induced errors) are scrambled and may be sufficiently randomized to substantially assume noise-like characteristics. Statistical properties of a sequence of substantially random scrambler codes SC and a configuration of scrambler circuit 206-6 may be selected such that a bit value b1 (in any given A/D conversion operation) is substantially equally likely to be coupled to any one of terminals T1, T2, T3, T4. Accordingly, an effective weighting factor of a representation of a sequence b1(n) (the representation included in a sequence of residues on sampling node 204) may be substantially a mean value of w(T1), w(T2), w(T3), and w(T4). Similar properties may characterize b1($n$), b2($n$), b3($n$), and b4($n$), each of which may be substantially represented by the same effective mean-value weighting factor.

A sequence of numerical representations DOUT(n) of a constant analog input signal VIN(t) may comprise a sequence of mismatch-induced errors ERR(n) caused by mismatch of weighting factors w(T1), w(T2), w(T3), w(T4). For a conventional SAR ADC 100 (FIG. 1), a sequence of mismatch-induced errors may be constant ERR(1)=ERR(2)=ERR(3)= . . . , and an average of several values DOUT(n) may not substantially improve an accuracy of a numerical representation. For ADC 200 (FIGS. 2 and 3), scrambler circuit 206-6 is configured to induce a sequence of mismatch-induced errors to vary from one sample to another, and an average of several values DOUT(n) may be a numerical representation of VIN having an improved accuracy.

A sequence of mismatch-induced errors ERR(n) may be of a substantially stochastic nature, and may be described by parameters commonly used to describe stochastic signals, such as noise. An objective of dynamic element matching may be to reduce a correlation of an analog signal VIN(t) and a sequence of mismatch-induced errors ERR(n) from A/D converting the analog signal VIN(t). L. Richard Carley described in 1989 that a mismatch-induced error sequence may be (substantially) a white-noise sequence with zero mean and having a variance depending on a degree of mismatch of weighting factors. Accordingly, an improved accuracy may be achieved by an averaging operation applied to a sequence of digital codes DOUT(n), even if the sequence DOUT(n) is from converting an input signal VIN(t) that may not be constant. An averaging operation (including a non-uniform weighted averaging operation) may be implemented as a digital filter processing DOUT(n). A degree to which accuracy is improved may depend on a degree to which a digital filter is configured to limit a noise bandwidth. A digital filter for reducing a noise bandwidth may be a finite-impulse-response (FIR) or an infinite-impulse-response (IIR) type digital filter effectively applying a sequence of impulse-response weighting coefficients to DOUT(n). Multi-rate digital filtering techniques may also be used.

If weighting factor mismatch is reduced to a low level (e.g., by estimating and applying weighting factors as described in U.S. Pat. No. 7,705,765) a variance of a mismatch-induced noise-like error sequence may be less than a variance of a thermal (or other) noise process characterizing an ADC circuit. Accordingly, it is optional to apply an averaging operation to improve accuracy. An embodiment of the present teachings may be configured to scramble a mismatch-induced error sequence to induce white-noise-like properties of such errors, and overall accuracy may be substantially determined by another white-noise-like process (e.g. thermal noise).

The dynamic element matching technique and circuit described by L. Richard Carley in 1989 has since been generalized to a class of dynamic element matching techniques and circuits known as "mismatch-shaping encoders". Scrambler circuit 206-6 (FIGS. 3, 4a and 4b) and the circuits described by L. Richard Carley may be classified as zero-order mismatch-shaping encoders, which nominally randomize mismatch-induced errors into a substantially white-noise-like error signal. First, second, and higher-order mismatch-shaping encoders nominally randomize mismatch-induced errors into a noise-like error signal having a substantially non-uniform spectral power density (e.g., having a relatively lower spectral power density in a signal band). First-order mismatch-shaping encoders configured to randomize mismatch-induced errors into a noise-like error signal having a relatively lower spectral power density at low frequencies are described in U.S. Pat. No. 6,348,884, which is included herein by reference for describing mismatch-shaping encoders. Scrambler circuit 206-6 (FIG. 3) may be substituted by another scrambler circuit for a mismatch-shaping encoder of any order. A mismatch-shaping encoder may be configured to randomize mismatch-induced errors into a noise-like signal having a relatively lower spectral power density at frequencies that are within a pass-band (signal-band) of a digital filter processing a sequence of digital codes DOUT(n). A pass-band may include a base-band range of frequencies (e.g., 0 Hz to 100 kHz), or it may be a band-pass range of frequencies (e.g., from 100 kHz to 200 kHz).

Scrambler circuit 206-6 is configured to substantially randomize mismatch-induced errors caused by mismatch of weighting factors for terminals T1, T2, T3, T4. An effective mean-value weighting factor may characterize a plurality of terminals coupled to a scrambler circuit.

Mismatch of weighting factors for the second plurality of input terminals 203-2 (T5, T6, T7, T8, T9, T10) with respect to an effective mean-value weighting factor characterizing the first plurality of input terminals 203-1 may also cause mismatch-induced errors. An objective of sampling an analog dither value on CDAC 201 by coupling substantially random bit values x5, x6, x7, x8, x9, x10 to input terminals 203-2 during acquisition periods may be to reduce a correlation of an analog signal VIN(t) with sequences of bit values y5($n$), y6($n$), y7($n$), y8($n$), y9($n$), y10($n$). For example, if a bit-value-difference sequence y5($n$)−x5($n$) is a white-noise-like sequence, then w(T5)*(y5($n$)−x5($n$)) may be a white-noise-like sequence for any fixed weighting factor w(T5), including a mismatched weighting factor. Accordingly, mismatch-induced errors from mismatch of weighting factors for input terminals 203-2 may be suppressed by an averaging operation limiting a noise bandwidth.

FIG. 5 shows a nominal functional relationship 220 of a residue value (vertical axis) for a value sampled on CDAC 201 (horizontal axis) after bit values b1, b2, b3, and b4 are determined by digital state machine 206-1 in ADC 200 (FIGS. 2 and 3). The sampled value may be expressed as (w(T1)+w(T2)+w(T3)+w(T4))*VIN+(w(T5)*x5+w(T6)*x6+w(T7)*x7+w(T8)*x8+w(T9)*x9+w(T10)*x10)*VREF or more compactly (for a selected scaling of weighting factors) as VIN+Vdither(DX). VIN is a value of VIN(t) sampled on sampling node 204 of CDAC 201 in combination with an analog dither value Vdither(DX). VIN may be any value in a full-scale range from 0V to VREF. An exemplary value VIN is marked on the horizontal axis in FIG. 5. If each bit value x5, x6, x7, x8, x9, x10 of digital dither code DX is a substantially random coin-toss sequence, then analog dither value Vdither(DX)=(w(T5)*x5+w(T6)*x6+w(T7)*x7+w(T8)*x8+w(T9)*x9+w(T10)*x10)*VREF may be a substantially stochastic quantity that may be substantially uniformly distributed in a range that is approximately as wide as a tooth-spacing 221 (VREF/4) of saw-tooth characteristic 220 in FIG. 5. Accordingly, a combination of VIN and an analog dither value sampled on node 204 may be substantially uniformly distributed in a range 222 marked on the horizontal axis. In approximation, a residue value corresponding to a stochastic variable uniformly distributed in range 222 may be a stochastic variable distributed in a range 223. Range 222 is mapped to range 223 by a high-lighted (by a relatively thicker line width) section of saw-tooth characteristic 220. Range 223 and stochastic properties of a residue value may be substantially independent of a value VIN in a range from 0V to VREF. At an end of an A/D conversion process, bit values y5, y6, y7, y8, y9, y10 may represent a residue value, and each bit value may be from a substantially stochastic coin-toss sequence. Accordingly, stochastic properties of an analog dither value Vdither(DX) may substantially randomize and induce stochastic properties for bit values y5, y6, y7, y8, y9, y10. A pseudo-stochastic variable DX may be provided by pseudo-random-number generator 206-4 to provide a substantially uniformly distributed pseudo-stochastic analog dither value Vdither(DX) that may be combined with VIN and sampled on CDAC 201 to induce (in approximation) desired pseudo-stochastic properties for bit values y5, y6, y7, y8, y9, y10. Accordingly, bit-value-difference sequences y5(n)−x5(n), y6(n)−x6(n), . . . , y10(n)−x10(n), may be substantially described as stochastic variables, and may be (in approximation) white-noise sequences.

Properties of Vdither(DX) may be selected in various ways to induce various desired statistical properties for mismatch-induced errors. For example, Vdither(DX) may be uniformly distributed in a range that is approximately as wide as one or more teeth of saw-tooth characteristic 220, or Vdither(DX) may be triangularly distributed in a range that is two teeth wide. Vdither(DX) may, but need not, be an uncorrelated (white-noise) stochastic sequence. Next, an embodiment will be described wherein Vdither(DX) is generated and applied to randomize and shape (a spectral power density of) mismatch-induced errors.

Figure 6:
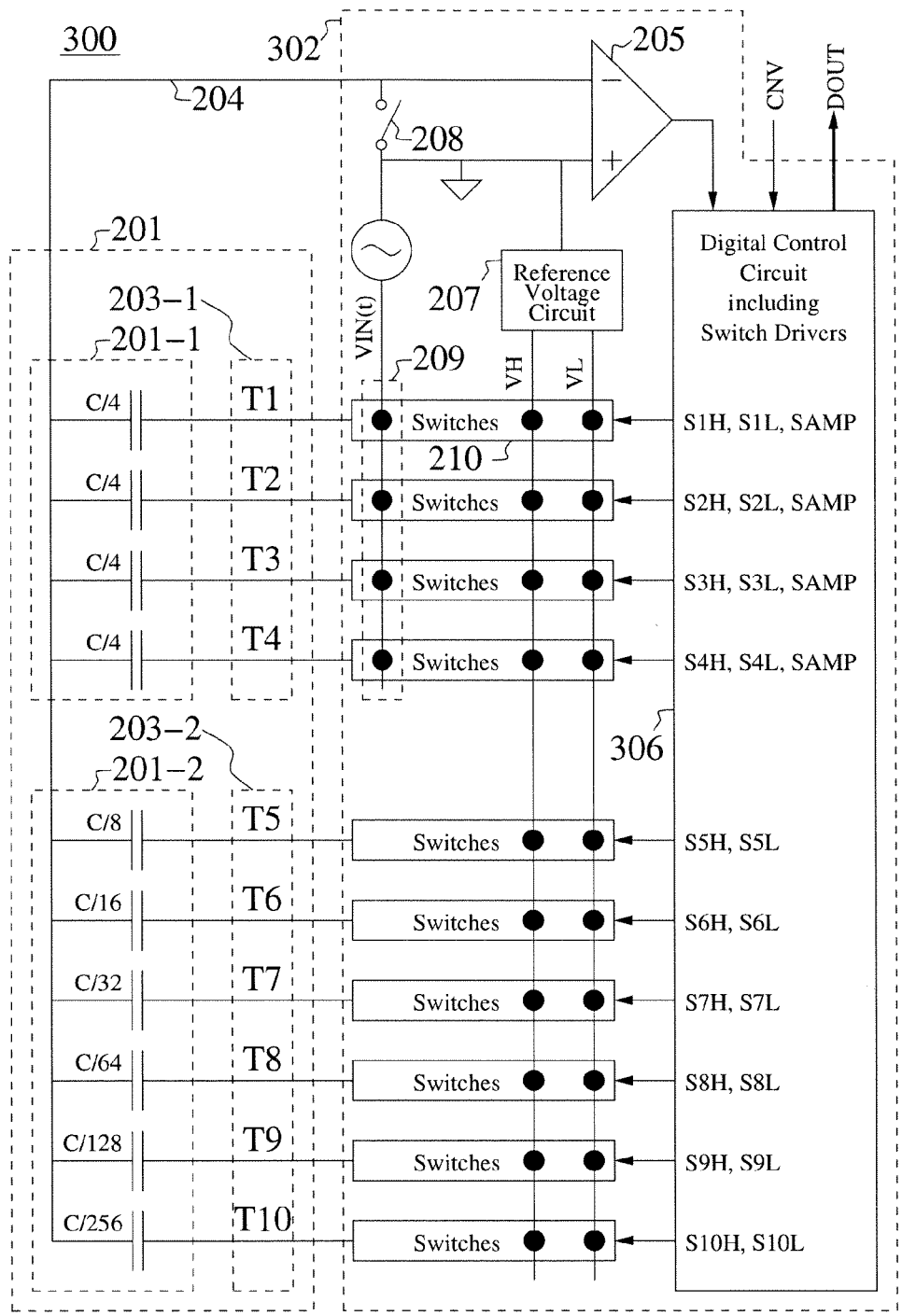
FIG. 6 illustrates a second preferred embodiment of the present teaching ADC 300.

FIG. 6 shows a second embodiment of the present teachings ADC 300. An aspect of ADC 300 is that a mismatch-induced error sequence that may be caused by mismatch of weighting factors w(T1), w(T2), . . . , w(T10) may be induced to be a substantially stochastic noise-like error signal having a substantially non-uniform spectral power density. A total power of a mismatch-induced error sequence may be related to a degree of mismatch of weighting factors. A non-uniform spectral power density may provide that a relatively small fraction of a total power of a mismatch-induced error signal may be present in a signal band of ADC 300. A digital filter (not shown) may be configured to suppress spectral power of DOUT(n) outside the signal band. The digital filter may thus provide an improved accuracy by limiting a noise bandwidth. ADC 300 may be configured to calculate DOUT(n) based on a plurality of assumed weighting factors determined at design time (before ADC 300 is manufactured). A noise-like mismatch-induced error signal having a substantial total power may be suppressed to below a thermal-noise level by limiting a noise bandwidth. In another embodiment, weighting factors may be estimated and stored after ADC 300 is manufactured to reduce a total power of a mismatch-induced error signal. Accordingly, a spectral power density of a mismatch-induced error signal may be lower than a spectral power density of a thermal noise in a signal band only, or it may be lower than a thermal noise at all frequencies in a Nyquist range of frequencies. It may be advantageous to use ADC 300 in either case.

Figure 7:
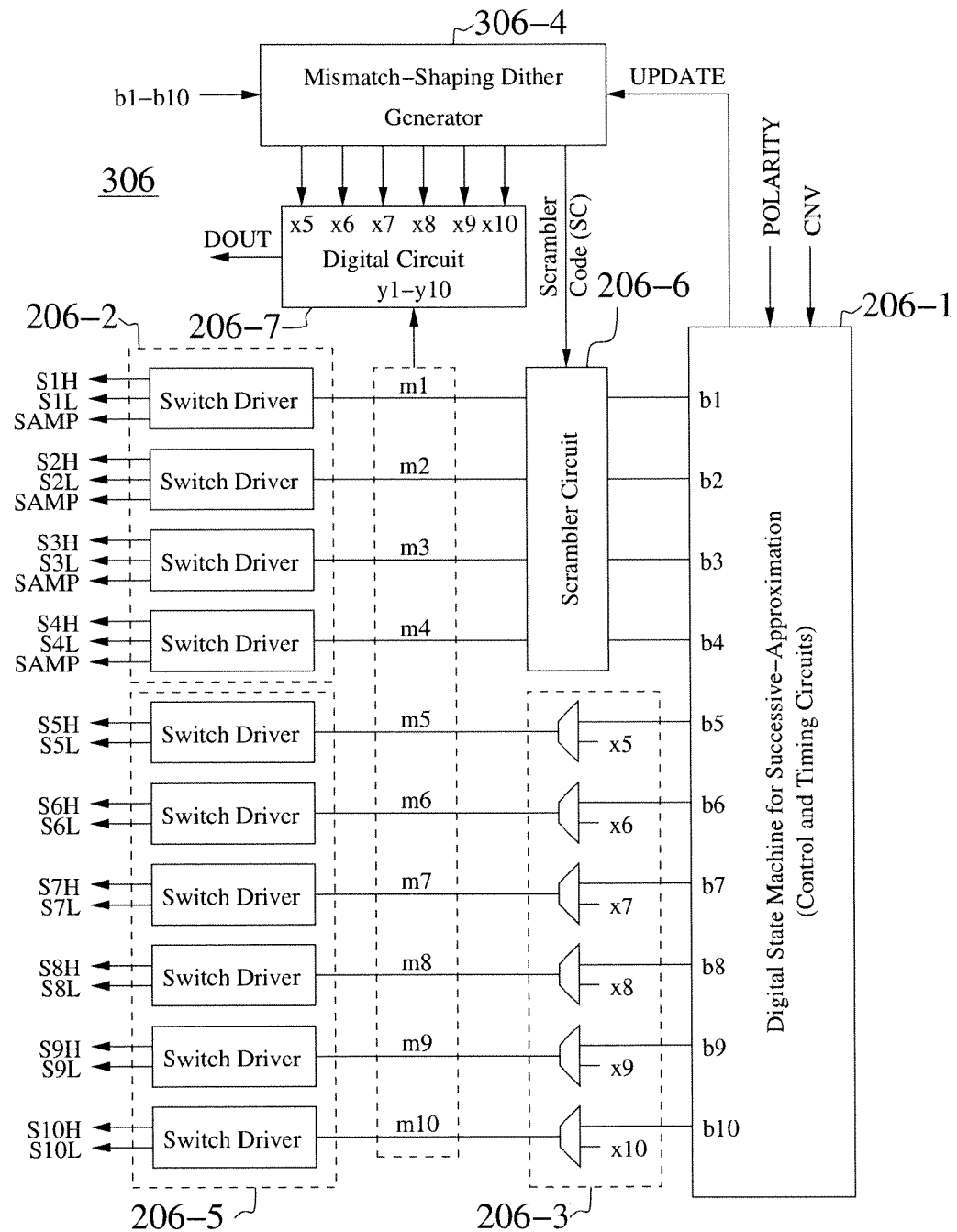
FIG. 7 illustrates a digital control circuit 306 incorporated in ADC 300 (FIG. 6)

ADC 300 of FIG. 6 is substantially identical to ADC 200 of FIG. 2, with the exception that digital control circuit 206 is substituted by another digital control circuit 306. Digital control circuit 306 shown in FIG. 7 is substantially identical to digital control circuit 206 of FIG. 3, with the exception that pseudo-random-number generator 206-4 in 206 is substituted by a mismatch-shaping dither generator 306-4 in 306. Similar to PRN generator 206-4, mismatch-shaping dither generator 306-4 is configured to provide sequences of scrambler codes SC and digital dither codes DX coupled to scrambler circuit 206-6 and digital multiplexer circuit 206-3. A difference between ADC 200 of FIG. 2 and ADC 300 of FIG. 6 relates to properties imposed on DX (bit values x5, x6, x7, x8, x9, x10) and SC (bit values sc1, sc2), to induce desired approximate statistical properties on mismatch-induced errors.

Mismatch-shaping dither generator 306-4 is configured to receive bit values b1, b2, . . . , b10 provided by digital state machine 206-1 at an end of an A/D conversion operation. Bit values b1, b2, b3, b4 may be a thermometer-type code 'b1_b2_b3_b4' (any one of codes '0000', '1000', '1100', '1110', '1111'). A thermometer-type code 'b1_b2_b3_b4' may be rotated according to scrambler code SC such that scrambler circuit 206-6 implements a first-order mismatch-shaping operation described in U.S. Pat. No. 5,221,926 or U.S. Pat. No. 6,348,884. Any other mismatch-shaping encoder circuit may be considered for substituting scrambler circuit 206-6. Some mismatch-shaping encoders may generate scrambler codes internally (i.e., they may be configured to include a portion of 306-4, and some mismatch-shaping encoders may be configured to receive an input signal encoded using binary-weighted codes (e.g., U.S. Pat. No. 5,684,482). A theory, implementation and operation of such mismatch-shaping encoders is well known by those skilled in the art, and need not be described in further detail.

Mismatch-shaping dither generator 306-4 is configured to provide digital dither codes DX such that an error that may be caused by mismatch of weighting factors of input terminals 203-2 is induced to be a substantially stochastic error sequence characterized by a spectral power density that is relatively lower in a selected signal band.

Digital circuit 206-7 is configured to calculate encoded numerical values DOUT=Y1*w(T1)+y2*w(T2)+y3*w(T3)+y4*w(T4)+(y5−x5)*w(T5)+(y6−x6)*w(T6)+(y7−x7)*w(T7)+(y8−x8)*w(T8)+(y9−x9)*w(T9)+(y10−x10)*w(T10). Spectral components of a mismatch-induced error sequence may include spectral components of bit-value-difference sequences: y5(n)−x5(n), y6(n)−x6(n), . . . , y10(n)−x10(n). Mismatch-shaping dither generator 306-4 is configured to induce desired spectral properties for each bit-value-difference sequence. A polarity of a next value for a bit-value-difference sequence may be selected prior to a sampling instance. Specifically, a bit value (e.g., x5) may be selected to be logic one to induce a non-positive polarity value in a bit-value-difference sequence (e.g., y5−x5) and may be selected to be logic zero to induce a non-negative polarity value in the bit-value-difference sequence. For example, if mismatch-shaping dither generator 306-4 provides x5=0, then y5−x5=y5−0 will be either 0 or 1 (i.e., non-negative) depending on how b5=y5 is set during an A/D conversion operation. If mismatch-shaping dither generator 306-4 provides x5=1, a resulting value of y5−x5=y5−1 will be either (−1) or 0 (i.e., non-positive).

Figure 8A:
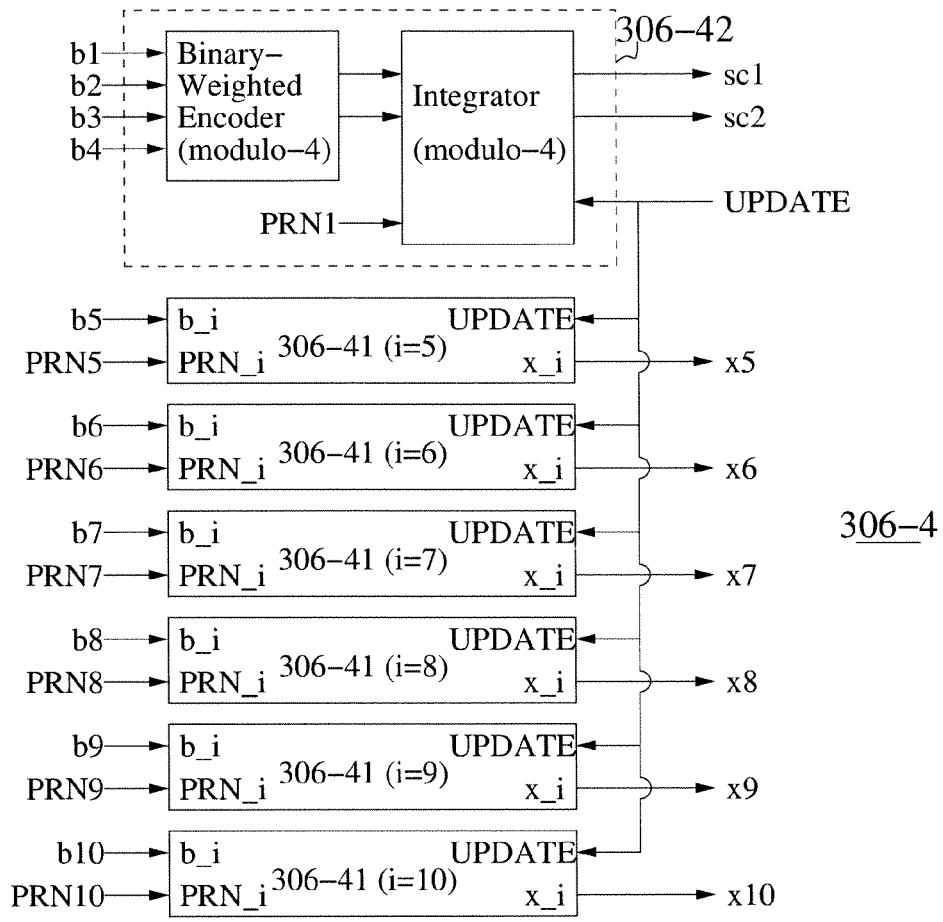
FIG. 8a illustrates a mismatch-shaping dither generator 306-4 incorporated in digital control circuit 306 (FIG. 7)

FIG. 8a shows mismatch-shaping dither generator 306-4 in more detail. Six instances of a mismatch-shaping dither generator 306-41 (FIG. 8b) are configured to generate bit values x5, x6, x7, x8, x9, x10 from bit values b5, b6, b7, b8, b9, b10 and substantially random bit values PRN5, PRN6, PRN7, PRN8, PRN9, PRN10 provided by a pseudo-random-number generator (not shown). A mismatch-shaping scrambler code generator 306-42 is configured to integrate binary-weighted values B(n)=b1(n)+b2(n)+b3(n)+b4(n) modulo-4. Mismatch-shaping scrambler code generator 306-42 may be configured to multiplex B(n) to two integration-modulo-4 circuits to suppress potential idle tones (see U.S. Pat. No. 6,348,884). Mismatch-shaping scrambler code generator 306-42 is configured to provide scrambler codes SC (bit values sc1 and sc2) to scrambler circuit 206-6 shown in FIGS. 4a, 4b, and 7.

Figure 8B:
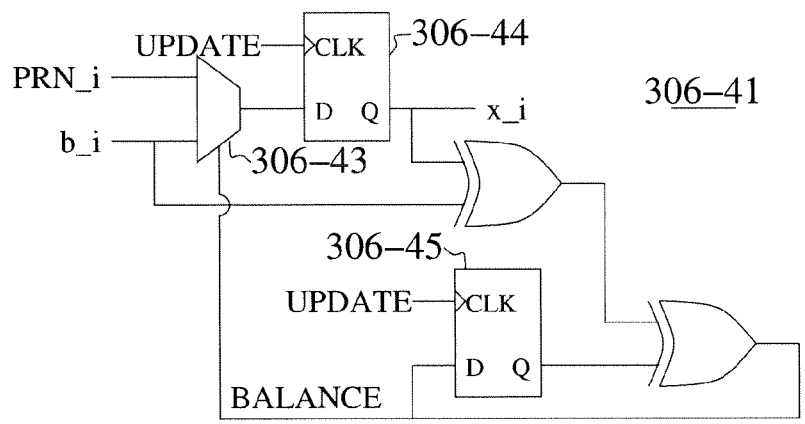
FIG. 8b illustrates a mismatch-shaping dither generator 306-41 incorporated in mismatch-shaping dither generator 306-4 (FIG. 8a)

FIG. 8b shows mismatch-shaping dither generator 306-41 in more detail. Mismatch-shaping dither generator 306-41 is configured to generate a bit-value x_i (e.g., x5 for i=5) from b_i (e.g., b5 for i=5) and a random bit value PRN_i (e.g., PRN5 for i=5). A next bit-value of x_i is provided by a flip-flop (FF) circuit 306-44 when UPDATE (see FIGS. 7 and 8a) transitions to indicate that an A/D conversion operation is complete and that a valid bit value b_i (e.g., b5=y5 for i=5) is provided as an input to mismatch-shaping dither generator 306-41. A binary signal BALANCE controls a digital multiplexer circuit 306-43 such that an input signal to FF 306-44 is b_i when BALANCE=0 and PRN_i when BALANCE=1. A second FF 306-45 is also clocked by UPDATE. FF 306-45 is configured to preserve a logic state stored in FF 306-45 when bit values x_i and b_i are identical, and to toggle the logic state when bit values x_i and b_i are different.

Consider an initial state of mismatch-shaping dither generator 306-41 for which BALANCE=1 at an UPDATE event. Input PRN_i of multiplexer 306-43 is coupled to FF 306-44, causing a random value PRN_i to be stored in FF 306-44 and applied as a next bit value x_i. A logic one (BALANCE=1) is stored in FF 306-45. If an A/D conversion operation provides b_i=x_i, then BALANCE=1 and the described scenario repeats at a next UPDATE event when a next random value PRN_i is stored in FF 306-44 for a next A/D conversion operation. At some point, an A/D conversion operation may provide a bit value b_i that is not identical to x_i, in which case an UPDATE event causes BALANCE=0 to be stored in FF 306-45 and bit value b_i is stored in FF 306-44 and provided as x_i. Flip-flop circuits 306-44 and 306-45 are configured to retain their logic states until an UPDATE event occurs for which bit values b_i and x_i are again different (causing BALANCE=1 at an UPDATE event, the initial state).

Accordingly, mismatch-shaping dither generator 306-41 may have two modes of operation. In a first mode of operation (BALANCE=0), a bit value x_i of a digital dither code DX is set equal to a bit value of a digital code DY derived in a preceding A/D conversion operation. In a second mode of operation (BALANCE=1), bit value x_i is set on a substantially random basis. Mismatch-shaping dither generator 306-41 is configured to switch between the first and second modes of operation when x_i and b_i are different.

Mismatch-shaping dither generator 306-41 is configured to ensure that a running sum (integral) of a bit-value-difference sequence $b\_i(n)-x\_i(n)$ is always in a range from negative one to positive one (for a selected origin of time n=0), and mismatch-shaping dither generator 306-41 may thus be characterized as a circuit controlling a spectral component of a bit-value-difference sequence $b\_i(n)-x\_i(n)$ (at 0 Hz). Mismatch-shaping dither generator 306-41 is configured to provide a substantially random bit value when the running sum of $b\_i(n)-x\_i(n)$ is zero (a predefined condition characterized by BALANCE=1), and to otherwise provide x_i as b_i delayed (another predefined condition characterized by BALANCE=0). Accordingly, a bit-value-difference sequence provided by mismatch-shaping dither generator 306-41 may be substantially randomized and have a relatively lower spectral power density in a selected signal band.

In another simplified embodiment, mismatch-shaping dither generator 306-41 may be substituted by a single flip-flop providing x_i by delaying a previous value of b_i, In other words, another mismatch-shaping dither generator may be equivalent to mismatch-shaping dither generator 306-41 operating only in the first mode of operation (BALANCE=0). A bit-value-difference sequence may be expressed as $b\_i(n)-x\_i(n)=b\_i(n)-b\_i(n-1)$, and thus spectral components may be suppressed in a signal band by a difference operation. For some applications, mismatch-shaping dither generator 306-41 may provide a more effective randomization of the bit-value-difference sequence.

FIG. 9 shows a block diagram for a mismatch-shaping dither generator 306-40. The block diagram reflects that a mismatch-shaping dither generator 306-40 may be designed explicitly as a closed-loop control system. For a set of design parameters, mismatch-shaping dither generator 306-41 may be modeled as 306-40, and the circuits are thus substantially equivalent. An input signal b(n) may be a single bit value signal (e.g. b_i in FIG. 8b) or a encoded numerical value comprising multiple bit values (e.g., b(n) may be a sequence of codes each comprising 3 bit values 'b5_b6_b7'). Likewise, a digital dither sequence x(n) may be a sequence of single bit values (e.g., x_i in FIG. 8b) or it may be a sequence of numerical values represented by codes comprising several bit values. (e.g., 'x5_x6_x7'). A difference between numerical values represented by b(n) and numerical values represented by x(n) is an input to a filter H(z). Filter H(z) may be of any order, and may have a frequency response that may be characterized as low-pass, band-pass, or high-pass. For example, a preferred embodiment may provide a second-order filter $H(z)=(1+0.25/(z+1))/(z+1)$. Filter H(z) may comprise explicit multi-bit registers for storing a binary-weighted encoded state variable, or it may comprise a plurality of flip-flop circuits for storing a less conventional representation of a state variable (e.g., flip-flip circuits 306-44 and 306-45 in FIG. 8b). In some embodiments, filter H(z) may be configured to impose saturation limits (and other types of non-linearities) on one or more state variables. PRN(n) is a sequence of substantially stochastic encoded numerical values, which is combined with (added to) an output from filter H(z). Digital dither sequence x(n) may be a quantized representation of a combination of PRN(n) and an output of filter H(z).

Dither generator 306-41 in FIG. 8b is a preferred implementation of mismatch-shaping dither generator 306-40 in FIG. 9. Specifically, H(z) may be a first-order low-pass filter and have a Z-domain transfer function $H(z)=1/(z+1)$. A numerical value of b(n) may be either 0 or 1. A numerical value of x(n) may be either 0 or 1. A numerical value of PRN(n) may be either +0.5 or −0.5. A pseudo-random sequence PRN(n) may approximate a coin-toss stochastic process. A quantization process may provide a bit value x(n)=1 when an input is greater than 0 and x(n)=0 otherwise. Accordingly, mismatch-shaping dither generator circuit 306-41 may be characterized as a closed-loop control system configured to induce a polarity of a bit-value-difference to suppress a spectral power density in a base-band signal band. Pseudo-random sequence PRN(n) is included to substantially randomize the bit-value-difference sequence, and hence an error induced by mismatch of weighting factors of a CDAC. A calculation of DOUT may include calculating a weighted sum of a plurality of substantially stochastic bit-value-differences, and a bit-value-difference may be characterized by a relatively lower spectral power density in a signal band.

FIGS. 10a, 10b, 10c show a performance of two embodiments of the present teachings compared to a performance of a prior-art SAR ADC. A resolution of a second plurality of capacitors (201-2 in ADC 200 of FIG. 2 and in ADC 300 of FIG. 6) may be increased to reduce a quantization error to a very low level (so that properties of a mismatch-induced error signal can be observed more clearly). Specifically the second plurality of capacitors may comprise capacitors with nominal values: C/8, C/8, C/16, C/32, C/64, C/128, C/256, C/512, C/1024, C/1024, C/2048, C/4096, C/8192, C/16384, C/32768, C/65536, C/65536, C/131072, C/262144, C/524288, C/1048576, C/1048576. It is well-known that voltage-division capacitive structures may be used as a substitute for small capacitors (e.g. C/1048576). It is also well-known that repeat nominal values (here C/8, C/1024, C/65536, C/1048576) may provide over-ranging to suppress potential missing-code type errors. Fully differential ADC structures are used to provide bipolar over-ranging correction. The second plurality of capacitors is coupled to first plurality of capacitors 201-1 (FIG. 2) in an increased resolution (differential) CDAC configured and operated as CDAC 201 in ADC 200 (FIG. 2) and in ADC 300 (FIG. 6). A resolution of digital control circuits 206, 306 and a number of switch drivers may be increased accordingly.

FIG. 10a shows a performance when digital control circuit 206 is configured to operate as in a conventional SAR ADC (i.e., when all bit values in dither code DX and scrambler code SC are set to zero). FIG. 10b shows a performance when digital control circuit 206 is configured to operate as described (each sequence of bit values in DX and SC is a substantially random coin-toss sequence). FIG. 10c shows a performance when digital control circuit 306 is configured to operate as described (bit values in DX and SC are generated to induce first-order mismatch shaping).

A selected plurality of assumed and actual weighting factors (reflecting mismatch) are the same for each of FIGS. 10a, 10b, 10c. A 4 kHz sinusoidal input signal VIN(t) is provided at a signal level 6 dB below a full scale. A sequence of signal values is sampled periodically at 2048 ksps, and corresponding sequences DOUT(n) are analyzed using a Fourier transformation.

FIG. 10a shows an observed spectral power density of DOUT(n) for a conventional SAR ADC. Harmonic distortion is induced by mismatch of weighting factors. A total power of harmonic distortion may be approximately 78 dB below full scale.

FIG. 10b shows an observed spectral power density of DOUT(n) for ADC 200 incorporating the increased resolution CDAC. A mismatch-induced error is substantially randomized, and is observed to have a substantially uniform spectral power density (similar to a white-noise signal). A total amount of power of an observed mismatch-induced error may be approximately 73 dB below full scale in a Nyquist range of frequencies (0 Hz to 1024 kHz). A digital filter may be configured to limit a noise bandwidth by a factor of 8 to 128 kHz, and to provide a digital signal having an increased accuracy. Specifically, a total amount of power of a mismatch-induced error comprised in a frequency range from 0 Hz to 128 kHz may be approximately 82 dB below full scale. If a noise bandwidth is instead reduced by a factor of 16 or 32, an inband power of a mismatch-induced error may be reduced to approximately 85 dB or 88 dB below full scale.

A digital filter may be configured to reduce a noise bandwidth of DOUT(n) provided by a conventional SAR ADC. However, substantial harmonic distortion may be present in a signal band. For example, a power of harmonic distortion shown in FIG. 10a may be reduced by less than 1 dB when a digital filter is configured to reduce a bandwidth by a factor of 32. Accordingly, a digital filter may be configured to perform an averaging operation whereby an accuracy of ADC 200 may be improved substantially more than an accuracy of a prior-art SAR ADC may be improved by the same digital filter.

FIG. 10c shows an observed spectral power density of DOUT(n) for ADC 300 (FIG. 6) incorporating the increased resolution CDAC. A mismatch-induced error is substantially randomized, and may be observed to have a relatively lower spectral power density at low frequencies. A total amount of power of an observed mismatch-induced error may be approximately 73 dB below full scale in a Nyquist range of frequencies (0 Hz to 1024 kHz). A digital filter may be configured to limit a noise bandwidth by a factor of 8, 16, or 32 and provide a digital signal wherein an inband power of a mismatch-induced error may be approximately 91 dB, 100 dB, or 109 dB below full scale. Accordingly, ADC 300 may be configured to provide a greater bandwidth and/or a better accuracy than ADC 200 or a prior-art SAR ADC.

Figure 11A:
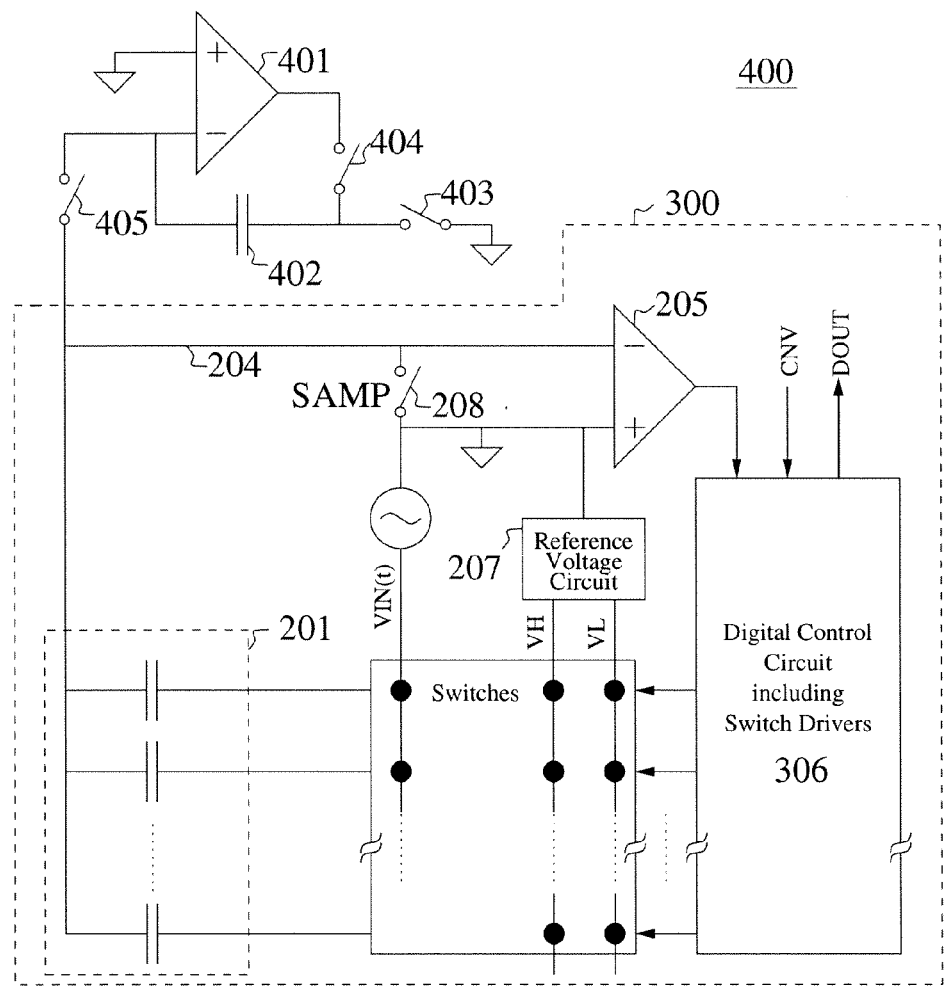
FIG. 11a illustrates a third preferred embodiment of the present teachings ADC 400.

FIG. 11a shows a third embodiment of the present teachings ADC 400. ADC 400 comprises an ADC circuit 300 that may be identical to (or a variation of) ADC 300 of FIG. 6. ADC 400 further comprises a switched-capacitor circuit comprising an amplifier circuit 401, a capacitor 402, and a plurality of switches 403, 404, 405. At an end of an A/D conversion operation of ADC 300, switch 403 is opened, and switch 404 is closed (switch 405 is already closed), whereby amplifier 401 is configured in a negative feedback configuration with capacitor 402 providing negative feedback. A charge portion representing a residue at sampling node 204 is transferred to capacitor 402 by amplifier 401. After a settling period of time, sufficiently long to allow for a substantially complete transfer of the residue, switch 405 is opened to sample the residue on capacitor 402. After sampling the residue on capacitor 402, ADC 300 is configured in a sampling configuration to acquire a next value VIN of VIN(t) in a manner described for ADC 300 of FIG. 6. Sampling switch 208 is opened at a sampling instance. A substantially isolated charge portion on sampling node 204 is a sampled value representing a combination of VIN and an analog dither value Vdither(DX) for a digital dither code DX provided by ADC 300. In sequence after the sampling instance, switch 405 is closed, switch 404 is opened, and switch 403 is closed. A charge portion representing a residue from a previous A/D conversion operation, sampled on capacitor 402 as described, is thereby transferred back to sampling node 204. Accordingly, for the A/D conversion operation, sampling node 204 represents an analog value comprising a portion of an analog signal value, a portion of an analog dither value, and a portion of residue sampled in a preceding A/D conversion operation. ADC 300 is then configured to derive a code DY, and a next residue is transferred to capacitor 402 by again configuring switches 403, 404, 405 as described. ADC 300 is configured to combine digital codes DX and DY to derive an encoded numerical representation DOUT of VIN.

Figure 11B:
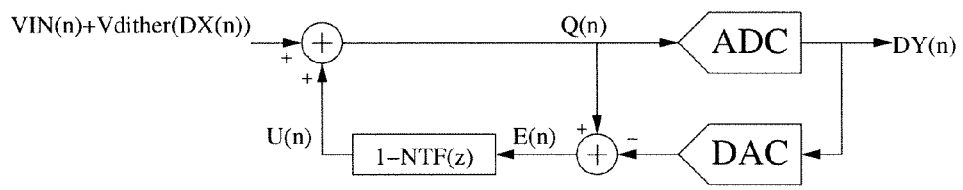
FIG. 11b illustrates a signal-flow model for ADC 400 (FIG. 11a).

FIG. 11b shows a signal-flow model for ADC 400. VIN(n)+Vdither(DX(n)) may represent a sequence of sampled values substantially isolated on sampling node 204 at sampling instances. U(n) may represent residues sampled on capacitor 402 and transferred to sampling node 204 after sampling instances. Q(n) may represent charge portions on sampling node 204 corresponding to codes DY(n) derived by ADC 300. E(n) may be a sequence of residue charge portions left on sampling node 204 after codes DY(n) are derived by ADC 300 and then transferred to capacitor 402. A filter with transfer function 1−NTF(z) may represent a delaying operation of sampling residues E(n) on capacitor 402 and adding them back one conversion cycle later, U(n)=E(n−1). Accordingly, using a Z-transformation, 1−NTF(z)=1/z, implying that a noise transfer function may be NTF(z)=1−1/z.

Those skilled in the art will recognize that the signal-flow model shown in FIG. 11b is that of a delta-sigma modulator configured in a so-called error-feed-back (EFB) topology. Accordingly, ADC 400 of FIG. 11a may be configured to randomize and shape a quantization error of DOUT according to a noise transfer function NTF(z)=1−1/z. ADC 400 may be configured to provide first-order suppression of quantization errors in a signal band. ADC 400 may further be configured to suppress mismatch-induced errors in the signal-band. ADC 400 is configured to combine a sampled value with a residue sampled in a preceding analog-to-digital conversion operation.

Several variations of the third embodiment are envisioned. In another embodiment, residues from several previous A/D conversion operations may be represented in a switched-capacitor circuit and they may be combined with a sampled value to achieve a higher degree of randomization and/or shaping of quantization errors. For example, an operation may be described by signal-flow model FIG. 11b, and a noise transfer function NTF(z) may be a second, third, or fourth order differentiation, a notch filter, or any other noise transfer function for use with a delta-sigma modulator.

Comparator circuit 205 may include one or more amplifier circuits. In another embodiment, amplifier circuit 401 may be implemented by circuitry that is included into comparator circuit 205. In another embodiment, amplifier circuit 401 may be a distinct (separate) circuit, and comparator circuit 205 may be coupled to an output of amplifier 401. In that case, switch 403 may be removed (always open), and switch 404 may be substituted by a wire (always closed). In another embodiment, amplifier circuit 401 may be used to sample a residue on capacitor 402 at an end of a first A/D conversion operation, and be configured and reused as an amplifier 218 in FIG. 4 of US Patent Application Publication US2011/0115661 A1 during a subsequent second A/D conversion operation.

In another embodiment, a CDAC may be configured to have a resolution exceeding a resolution of a digital code DY derived by successive approximation (or otherwise). Several capacitors in the CDAC may be configured to apply an analog dither value Vdither(DX) during an acquisition period, and need not be applied a bit value of DY during an A/D conversion operation. A digital dither code DX applied to a CDAC may thus have a least-significant-bit step size that is smaller than a least-significant-bit step size of an A/D conversion process. Some bit values in a digital dither code DX may be substantially random, while other bit values in DX may be generated to shape a spectral power density of a bit-value-difference sequence. Some input terminals of a CDAC may be applied a pre-determined fixed value during acquisition periods.

Figure 12A:
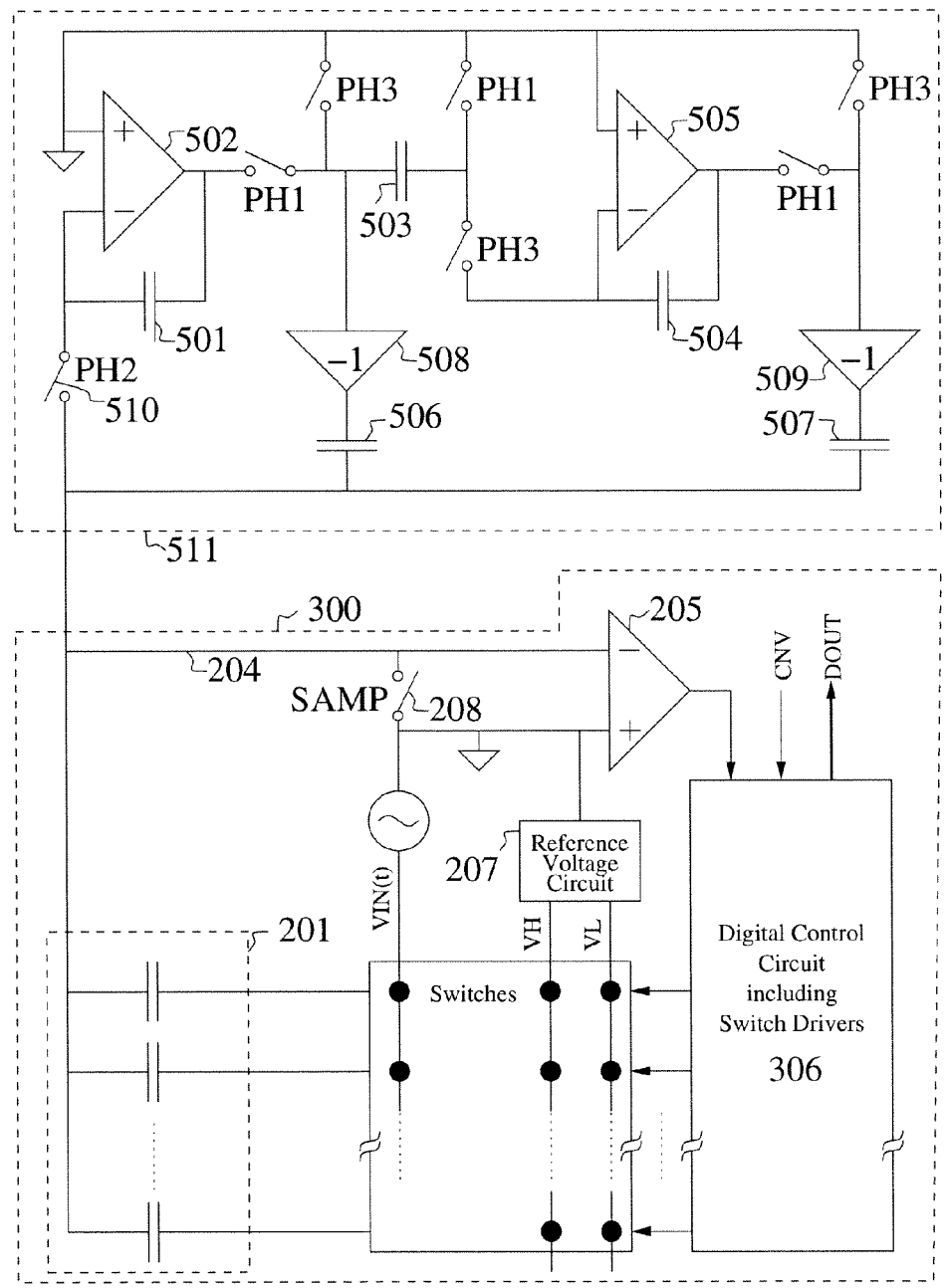
FIG. 12a illustrates a fourth preferred embodiment of the present teachings ADC 500.
Figure 12B:
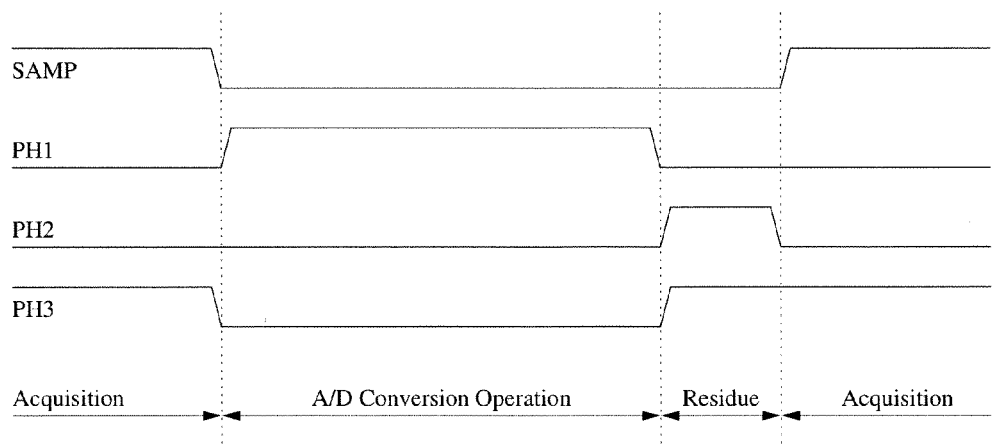
FIG. 12b illustrates a timing diagram for ADC 500 (FIG. 12a)
Figure 12C:
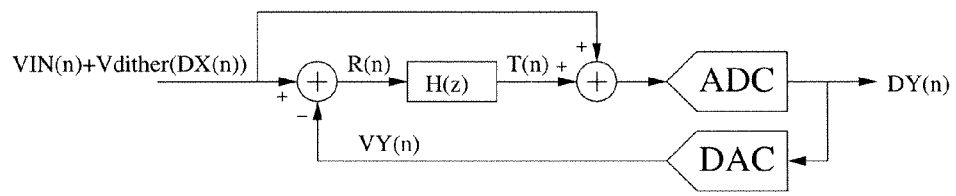
FIG. 12c illustrates a signal-flow model for ADC 500 (FIG. 12a).

FIG. 12a shows a fourth embodiment of the present teachings ADC 500. FIG. 12b shows a timing diagram for ADC 500, illustrating when a plurality of switches (labeled in FIG. 12a by timing control signals SAMP, PH1, PH2, and PH3) are open and closed. FIG. 12c shows a signal-flow model of ADC 500. ADC 500 is similar to ADC 400 in that it is configured to substantially randomize and shape a quantization error of an ADC circuit 300. ADC circuit 300 may be identical to (or a variation of) ADC 300 of FIG. 6. After an A/D conversion operation, when timing control signal PH2 is high (FIG. 12b), a switched-capacitor circuit 511 (FIG. 12a) is configured to transfer a charge portion representing a residue R(n) (FIG. 12c) from sampling node 204 (FIG. 12a) to a capacitor 501. Capacitor 501 and an amplifier 502 are configured to provide a voltage that is substantially a running sum (integration) of residues R(n) with a negative polarity. A capacitor 503 is switched to transfer charge portions to another capacitor 504 and an amplifier 505 configured to provide a voltage that substantially represents a running sum of the running sum (second-order integration) of R(n) with a negative polarity. At a beginning of an A/D conversion operation, amplifiers 502, 505 provide voltages that represent a history (a filtered version) of residues R(n) for a plurality of previous A/D conversion operations. Accordingly, residues R(n) are sampled at an output 204 of CDAC 201 and provided as an input to switched capacitor filter 511. Switched-capacitor filter 511 combines a value sampled on node 204 with residues from a first preceding ADC operation, a second preceding ADC operation, a third preceding ADC operation, et cetera.

ADC 300 (FIG. 12a) samples an input voltage signal VIN (t) in a manner described for ADC 300 of FIG. 6. A substantially isolated charge portion on sampling node 204 is a sampled value representing a combination of a signal value VIN and an analog dither value Vdither(DX). During acquisition periods, a capacitor 506 and a capacitor 507 are coupled to predefined potentials (ground). After a sampling instance, at a beginning of an A/D conversion operation, capacitors 506, 507 are switched to outputs of amplifiers 502, 505 to add a filtered version T(n) of R(n) to the sampled value on sampling node 204. Accordingly, for the A/D conversion operation, sampling node 204 represents an analog value comprising a portion of an analog signal value, a portion of an analog dither value, and portions for a plurality of residues sampled in preceding A/D conversion operations. Polarity-inverting circuits 508, 509 may be implemented by interchanging a positive and a negative output terminal for each amplifier 502, 505 in a fully-differential implementation of ADC 500 and switched-capacitor circuit 511 (well-known by someone ordinarily skilled in the art). Accordingly, as shown in FIG. 12c, a filter H(z) receives a sampled residue signal R(n) and provides a filtered version T(n) of R(n). T(n) is added to a sampled value VIN(n)+Vdither(DX(n)) and provided as an input to an ADC. An impulse response of transfer function H(z) may characterize T(n) as a weighted sum of residues from preceding A/D conversion operations.

ADC 300 is configured to derive a code DY for which a residue on sampling node 204 is within a predefined range corresponding to a resolution (quantization). Accordingly, DY(n) may be a quantized representation of VIN(n)+Vdither (DX(n))+T(n) as shown in FIG. 12c. Notice that capacitors 506, 507 are switched back to the predefined potential (ground) when switch 510 is closed by timing control signal PH2. Accordingly, residue R(n) transferred to capacitor 501 is a residue of the sampled value VIN+Vdither(DX) with respect to the derived code DY. The filtered version T(n) is only temporarily transferred to (represented on) sampling node 204 during the A/D conversion operation to derive digital code DY; it is subsequently removed and substantially not included in residue R(n) transferred to capacitor 501. In another embodiment, other means may be used to provide a signal path from T(n) to DY(n). For example, capacitors 506, 507 (FIG. 12a) may be removed, and circuits 508, 509 may be substituted by transconductance stages providing currents configured to induce an offset in comparator circuit 205. A delta-sigma circuit is provided for randomizing and shaping a quantization error when a circuit is configured for a weighted sum (a filtered version) of residues from previous A/D conversion operations to induce a bias in a quantization error of a encoded numerical representation DOUT of an analog signal value.

It will be understood that individual signal paths shown in FIG. 12c do not necessarily correspond to distinct physical circuit nodes of ADC 500. Those who are skilled in the art will recognize that the signal-flow model shown in FIG. 12c is that of a delta-sigma modulator, and that a transfer function H(z) of switched-capacitor filter 511 may be selected to obtain a desired noise transfer function for substantially randomizing and shaping a quantization error. For example, H(z) may be a cascade of any number of integrators configured with local feedback paths for resonance to provide a large amount of gain in a selected signal band.

A fifth embodiment of the present teachings may have a structure similar to ADC 200 of FIG. 2. Digital control circuit 206 (FIG. 3) may be modified to implement an A/D conversion operation wherein all values of scrambler code SC are used during the A/D conversion operation of a single value sampled on CDAC 201. Specifically, a first successive-approximation operation may provide a first digital code DY_00 for SC='00'. A second successive-approximation operation may provide a second digital code DY_01 for SC='01'. A third successive-approximation operation may provide a third digital code DY_10 for SC='10'. A fourth successive-approximation operation may provide a fourth digital code DY_11 for SC='11'. An encoded numerical representation DOUT may be an average value of DOUT_00 (calculated as described herein for DX, and DY=DY_00), DOUT_01 (calculated as described herein for DX, and DY=DY_01), DOUT_10 (calculated as described herein for DX, and DY=DY_10), and DOUT_11 (calculated as described herein for DX, and DY=DY_11). A CDAC for use with this fifth embodiment may preferably incorporate over-ranging, so that digital codes DY_01, DY_10, and DY_11 can be derived with relatively few steps of successive-approximation once code DY_00 is determined. Differences between DY_00, DY_01, DY_10, and/or DY_11 may reflect mismatch of weighting factors w(T1), w(T2), w(T3), and w(T4), and a CDAC may be configured to incorporate an over-range that can accommodate such differences without changing a first plurality of bit values (e.g. b1, b2, b3, b4, b5, b6, b7, b8). An aspect of the fifth embodiment is that bit values b1, b2, b3, b4 scrambled by scrambler circuit 206-6 are all substantially represented by one common weighting factor w(T1234)=w(T1)/4+w(T2)/4+w(T3)/4+w(T4)/4. Accordingly, mismatch of weighting factors w(T1), w(T2), w(T3), w(T4) are suppressed by an averaging operation that is internal to a single A/D conversion operation (unlike an averaging operation implemented by a digital filter, which may be viewed as averaging across several A/D conversion operations).

In other embodiments of the present teachings, an averaging operation of a plurality of weighting factors that is internal to a single A/D conversion operation (similar to the described fifth embodiment) may be combined with ADC 300 of FIG. 6, ADC 400 of FIG. 11*a*, and/or ADC 500 of FIG. 12*a*.

The present teachings have described several embodiments incorporating a digital control circuit for successive approximation. Those skilled in the art will recognize that the present teachings are not dependent on how a digital code is derived, and that a successive-approximation A/D conversion operation is provided only as an example. Other embodiments of the present teachings may use other circuits and/or methods to provide a digital code representing a value sampled on a CDAC. For example, US Patent Application Publication US 2011/0115661 A1 describes circuits and methods for deriving a digital code in relatively fewer steps (e.g. a 16-bit code may be derived in 4 steps). US Patent Application Publication US 2011/0115661 A1 further describes how a CDAC may be used to provide negative feedback for an amplifier circuit, and that a multi-bit comparator circuit (flash ADC) may be configured to evaluate a residue at a node of a CDAC other than at a sampling node. The present teachings may advantageously be combined with the teachings of US Patent Application Publication US 2011/0115661 A1 (and many other types of analog-to-digital converters).

A binary-to-thermometer encoder circuit, or another dedicated encoder circuit, may be used to bring a digital code from a SAR (or other) digital control circuit to a format that is required for a particular type of scrambler circuit for a mismatch-shaping encoder. An input to scrambler 206-6 of FIGS. 4*a* and 4*b* (and other known scrambler circuits) need not be encoded in a thermometer-code format when it is operated as a zero-order mismatch-shaping encoder as in ADC 200 (i.e., controlled by a substantially random scrambler code SC). For example, digital state machine 206-1 (FIG. 3) may be configured to skip a step described herein to determine bit value b2, and instead set bit value b2 equal to bit value b1 (thus shortening a conversion time).

Various types of scrambler circuits may be provided to implement a mismatch-shaping encoder. Well known examples include a rotary scrambler (U.S. Pat. No. 5,221,926), a butterfly scrambler (U.S. Pat. No. 5,404,142), a tree scrambler (U.S. Pat. No. 5,684,482), and others. A scrambler circuit may be controlled by a scrambler code selecting a permutation supported by the scrambler circuit in response to one or more random bit values and/or bit values provided as an input to the scrambler circuit. Some scrambler circuits support more permutations than other scrambler circuits do, and a resolution of a scrambler code may vary from one type of scrambler circuit to another type. A permutation of N terminals may be described by a sequence (an ordered plurality of input terminals being re-ordered into a sequence for an ordered plurality of output terminals). If a digital code is determined sequentially in a plurality of steps, and a first and a second bit value is determined in any one step, then no distinction shall be made with respect to whether the first bit value is determined before or after the second bit value. A scrambler circuit may provide two-or-more permutations for two-or-more bit values. Some scrambler circuits (e.g. tree-type scrambler circuits) may include an encoding function (e.g., binary-weighted to unit-weighted codes), and may not have the same number of input and output terminals. A permutation/sequence for such scrambler circuits may be determined/defined after separating the composite function into a separate encoding function and a separate scrambling function.

A scrambler circuit need not be a circuit block configured between a digital state machine and a CDAC. A comparator circuit may comprise a scrambler circuit and provide a scrambled multi-bit indication of an output of a CDAC. The scrambled multi-bit indication may be applied to the CDAC without further scrambling. For example, a flash ADC may be a comparator circuit providing a scrambled multi-bit indication when a scrambler circuit is configured to provide a scrambled plurality of reference potentials (instead of a conventional fixed plurality of reference potentials, e.g., provided by a resistive reference ladder).

Some embodiments of the present teachings do not require a scrambler circuit. For example, a variation of ADC 300 may be configured to operate with a CDAC having only one capacitor (C/4) instead of first plurality of capacitors 201-1. VIN(t) may be sampled on the one capacitor (C/4) and all other capacitors in the CDAC may be used to apply a digital dither code DX. Only one permutation of a single bit value exists (all permutations are realized by a wire substituting scrambler circuit 206-6). Accordingly, embodiments of the present teachings may be configured to operate without a scrambler circuit.

Some embodiments of the present teachings may use one or more separate structures to sample one or more signal values at a sampling instance. A sampled signal value may subsequently (i.e., after the sampling instance) be transferred to a CDAC for an A/D conversion operation. A signal value sampled on a capacitor may be transferred to a CDAC by connecting a terminal of the capacitor to a sampling node of the CDAC. In some embodiments, a differential analog voltage signal value may be applied to a first and a second input terminal of a capacitive structure at a sampling instance, and the first and the second input terminals may be shorted during an analog-to-digital conversion operation (and not necessarily applied a reference voltage potential).

Some embodiments of the present teachings may be configured to operate with assumed weighting factors determined at design time. Other embodiments of the present teachings may combine bit values of codes applied to a CDAC circuit with codes representing estimated values of one or more assumed weighting factors.

In some embodiments, a mismatch-induced error may be relatively small and may be substantially masked by other imperfections such as thermal noise. Accordingly, some embodiments of the present teachings may be configured to operate as Nyquist-rate analog-to-digital converters (not involving any averaging by a digital filter).

Numerous variations of the present teachings are envisioned. Embodiments described herein are merely illustrations of exemplary embodiments. An appropriate choice of circuitry may depend on a specific application and other factors such as available types of semiconductors, capacitors, resistors, reliability voltage limits, silicon area, cost, and additional factors and considerations typically involved in a design of an integrated circuit. For example, a digital control circuit may be implemented as a state machine in a CMOS technology, or using any other known circuit technique, method and/or process technology suitable for an implementation of such circuits. Various embodiments may incorporate switches implemented as CMOS transmission-gate switches, bootstrapped switches, single-device switches, and/or any other suitable switching devices. For example, an operation of a switch shall include circuits of a type known as "switched-opamp", wherein a switch is an implicit aspect of controlling an output impedance of an amplifier. An ADC system implemented according to the present teachings may incorporate a plurality of types of semiconductor devices (including all flavors of MOS, BJT, IGBT, IGFET, JFET, FINFET, organic transistors, nano-carbon-tube devices, electro-mechanical switches etc.), some of which may be selected to withstand a high-voltage input signal VIN(t), and some of which may be selected for fast settling of low-voltage circuit nodes. Accordingly, an ADC system may be implemented using a process technology that provides asymmetrical devices (BCD etc.) in addition to symmetrical MOS devices, and a process technology may incorporate oxides and other physical structures having a plurality of dimensions and electrical properties. Those who are skilled in the art will recognize that ADC systems 200, 300, 400, and 500 (depicted in FIGS. 2, 6, 11a, 12a) and any other single-ended embodiment of the present teachings may be modified to a similar fully-differential exemplary embodiment of the present teachings. Accordingly, an ADC system according to the present teachings may interface differential signals with an arbitrary common-mode voltage level. Other embodiments may interface single-ended signals (unipolar or bipolar) defined with respect to a reference voltage potential that may or may not be sampled substantially at the same time as an input voltage signal is sampled (pseudo-differential operation). A full-scale range of an ADC system according to the present teachings may be substantially a reference voltage range. Alternatively, an ADC system according to the present teachings may incorporate analog scaling and/or digital scaling techniques to provide one or more selectable full-scale ranges that are either wider or narrower than a reference voltage range. Input signals may be provided by active and/or passive circuits, which may be designed to optimize various performance parameters, such as settling time, noise bandwidth, distortion, power consumption, etc. An ADC system according to the present teachings may consume very little power (including substantially zero power) during an acquisition period when a capacitor is configured to be charged according to an input signal while active circuitry is in a power-down (or other reduced-power) configuration. A common-mode shift, charge-pumping, and other techniques may be applied during one or more steps of an A/D conversion process to make circuitry operate with respect to a desired operating point (e.g. to substantially isolate a charge portion and/or to avoid substantial forward-biasing of isolating PN junctions, or to provide a desired frequency response, gain function, etc.). A comparator circuit may provide an indication of a polarity, an indication of a potential (e.g., flash ADC), or some other type of indication that may be used to derive or refine a code representing a sampled value. For example, an oscillator controlled by a residue (e.g., a VCO) may provide an indication as a phase shift that may occur during a period of time. Redundancy and over-ranging may be incorporated in various embodiments of the present teaching. A degree of redundancy and over-ranging may be selected to meet specific objectives, such as conversion rate, latency, resolution, environmental parameters, circuit complexity, etc.

Various types of pseudo-random-number (PRN) generators are known to someone ordinarily skilled in the art. For example, a PRN generator may be implemented as a LFSR circuit and/or a CASR circuit providing one or more sequences of bit values that may repeat after a period of time (split seconds, minutes, or thousands of years). Improved pseudo-stochastic properties may be achieved by combining multiple different PRN structures. For example, a first-length sequence of bit-values from a LFSR circuit may be combined with a second-length sequence from a CASR circuit by an exclusive-or operation. Further improved stochastic properties may be obtained by combining a PRN bit-value sequence with a bit-value sequence obtained by quantizing a physical-noise process (e.g., thermal noise). Non-conventional structures may be used to generate bit-value sequences that may be classified as substantially random. For example, PRN5 in mismatch-shaping dither generator 306-4 (FIG. 8a) may be provided by applying a non-linear operation to a plurality of bit values (e.g., x6 EXOR x7), preferably including a bit value obtained from a physical stochastic process (e.g., a least-significant bit from an A/D conversion operation that is substantially limited by thermal noise).

Any known method to overcome or suppress imperfections of an analog-to-digital converter circuit (or sub-circuit, e.g. a reference voltage circuit) is envisioned to be used in combination with this present teaching. This present teaching may be incorporated as a subsystem in a larger ADC system (e.g., it may be combined with other types of ADCs, including pipeline ADCs, SAR ADCs, delta-sigma ADCs, etc.). The present teachings may be embodied in electrical and/or electro-mechanical systems of a higher degree of functional complexity, such as industrial control systems, medical applications (e.g., x-ray and MRI machines), consumer application (e.g., games and television), et cetera. An ADC system according to the present teachings may provide multiple channels to interface several distinct analog signals, e.g., via a multiplexing front-end circuit and/or an array of sample-and-hold circuits. A mismatch-shaping dither generator (e.g. 306-41 in FIG. 8b) may operate on a per-channel basis, such that registers (e.g., flip-flop circuits 306-44, 306-45 in FIG. 8b) are implemented for each input channel and updated only when a sample from a particular input channel is A/D converted. An ADC system implemented according to the present teachings may be implemented on a single semiconductor substrate, or as multiple semiconductors in a package, or as several devices assembled on a printed circuit board (or otherwise). An ADC implemented according to the present teaching may incorporate timing circuits causing transitions between various configurations, and/or it may receive timing signals provided by an external source. Digital codes and numerical representations of analog signal values may be encoded in various formats, and may be communicated to external systems in a serial format, a parallel format, or some other format deemed suitable or advantageous for an application. Such digital codes may be communicated (and power may be provided) via an interface providing galvanic isolation to limit interference, enhance safety, or to derive some other benefit.

Accordingly, while particular embodiments of the present teaching have been shown and described, it will be obvious to those skilled in the art that changes and modifications may be made without departing from this present teaching in its broader aspects and, therefore, the appended claims are to encompass within their scope all such changes and modifications that are within the true spirit and scope of this present teaching.

What is claimed is:

1. An analog-to-digital converter system comprising:
   a sampling digital-to-analog converter configured to sample a combination of an analog signal value and an analog dither value;
   a control circuit comprising a mismatch-shaping encoder, the control circuit configured to sequentially apply a plurality of digital codes to the sampling digital-to-analog converter during an analog-to-digital conversion operation to derive a digital code representing the combination of the analog signal value and the analog dither value.

2. The analog-to-digital converter system of claim 1, including circuitry configured to perform at least one step of successive approximation during the analog-to-digital conversion operation.

3. The analog-to-digital converter system of claim 1, wherein the mismatch-shaping encoder is configured to suppress in a signal band an error induced by mismatch of a plurality of weighting factors of the sampling digital-to-analog converter.

4. The analog-to-digital converter system of claim 1, wherein the mismatch-shaping encoder is configured to substantially randomize an error induced by mismatch of a first plurality of weighting factors of the sampling digital-to-analog converter.

5. The analog-to-digital converter system of claim 4 further comprising a dither generator circuit configured to provide the analog dither value; the dither generator circuit configured to substantially randomize an error induced by mismatch of a second plurality of weighting factors of the sampling digital-to-analog converter.

6. The analog-to-digital converter system of claim 1, wherein an encoded numerical representation of the analog signal value is derived in part by calculating a weighted sum of a plurality of substantially stochastic bit-value-differences.

7. The analog-to-digital converter system of claim 6, wherein a coefficient for calculating the weighted sum is derived after the analog-to-digital converter system is manufactured.

8. The analog-to-digital converter system of claim 6, wherein a substantially stochastic bit-value-difference in the plurality of substantially stochastic bit-value-differences is characterized by a relatively lower spectral power density in a signal band.

9. The analog-to-digital converter system of claim 1, further comprising a dither generator circuit configured to apply a digital dither code to the sampling digital-to-analog converter at a sampling instance.

10. The analog-to-digital converter system of claim 9, wherein the control circuit is configured to combine the digital dither code with the digital code representing the combination of the analog signal value and the analog dither value to derive an encoded numerical representation of the analog signal value.

11. The analog-to-digital converter system of claim 9, wherein a bit value of the digital dither code is a substantially random quantity.

12. The analog-to-digital converter system of claim 9, wherein the dither generator circuit is configured to be responsive to a digital code derived by the control circuit in a preceding analog-to-digital conversion operation to represent a sampled value.

13. The analog-to-digital converter system of claim 9, wherein the dither generator circuit is configured to substantially randomize a plurality of bit values in the digital code representing the combination of the analog signal value and the analog dither value.

14. The analog-to-digital converter system of claim 9, wherein the dither generator circuit in a first mode of operation is configured to set a bit value of the digital dither code according to a bit value of a digital code derived by the control circuit in a preceding analog-to-digital conversion operation to represent a sampled value.

15. The analog-to-digital converter system of claim 14, wherein the dither generator circuit is configured to switch between the first mode of operation and a second mode of operation; the dither generator circuit in the second mode of operation configured to set said bit value of said digital dither code on a substantially random basis.

16. The analog-to-digital converter system of claim 1, wherein the control circuit is configured to provide an indication of a residue of the combination of the analog signal value and the analog dither value with respect to a digital code applied to the sampling digital-to-analog converter.

17. The analog-to-digital converter system of claim 1 further comprising a digital filter configured to limit a noise bandwidth.

18. The analog-to-digital converter system of claim 1, including circuitry configured to apply an averaging operation.

19. The analog-to-digital converter system of claim 1, including circuitry configured to substantially randomize and suppress in a signal band a spectral power density of a quantization error.

20. The analog-to-digital converter system of claim 1 further comprising a switched-capacitor filter configured to receive a residue value.

* * * * *